United States Patent
Huang et al.

(10) Patent No.: US 12,148,706 B2
(45) Date of Patent: Nov. 19, 2024

(54) SUBSTRATE LOSS REDUCTION FOR SEMICONDUCTOR DEVICES

(71) Applicant: Taiwan Semiconductor Manufacturing Company, Ltd., Hsin-Chu (TW)

(72) Inventors: Xin-Hua Huang, Xihu Township (TW); Chung-Yi Yu, Hsin-Chu (TW); Kuei-Ming Chen, New Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/302,197

(22) Filed: Apr. 18, 2023

(65) Prior Publication Data

US 2023/0253334 A1    Aug. 10, 2023

Related U.S. Application Data

(60) Continuation of application No. 17/568,881, filed on Jan. 5, 2022, now Pat. No. 11,652,058, which is a
(Continued)

(51) Int. Cl.
*H01L 21/76* (2006.01)
*H01L 21/768* (2006.01)
(Continued)

(52) U.S. Cl.
CPC .... *H01L 23/5384* (2013.01); *H01L 21/76898* (2013.01); *H01L 23/481* (2013.01);
(Continued)

(58) Field of Classification Search
CPC ............. H01L 29/778; H01L 29/66462; H01L 29/7787; H01L 29/66431; H01L 23/481;
(Continued)

(56) References Cited

U.S. PATENT DOCUMENTS 8,629,037 B2   1/2014   Nieh et al.
8,975,670 B2   3/2015   Or-Bach et al.
(Continued)

OTHER PUBLICATIONS

Notice of Allowance dated Sep. 9, 2021 for U.S. Appl. No. 17/012,490.
(Continued)

*Primary Examiner* — Didarul A Mazumder
(74) *Attorney, Agent, or Firm* — Eschweiler & Potashnik, LLC

(57) ABSTRACT

Various embodiments of the present disclosure are directed towards an integrated circuit (IC) chip comprising a semiconductor device that is inverted and that overlies a dielectric region inset into a top of a semiconductor substrate. An interconnect structure overlies the semiconductor substrate and the dielectric region and further comprises an intermetal dielectric (IMD) layer. The IMD layer is bonded to the top of the semiconductor substrate and accommodates a pad. A semiconductor layer overlies the interconnect structure, and the semiconductor device is in the semiconductor layer, between the semiconductor layer and the interconnect structure. The semiconductor device comprises a first source/drain electrode overlying the dielectric region and further overlying and electrically coupled to the pad. The dielectric region reduces substrate capacitance to decrease substrate power loss and may, for example, be a cavity or a dielectric layer. A contact extends through the semiconductor layer to the pad.

20 Claims, 33 Drawing Sheets

Related U.S. Application Data division of application No. 17/012,490, filed on Sep. 4, 2020, now Pat. No. 11,222,849.

(60) Provisional application No. 63/014,841, filed on Apr. 24, 2020.

(51) Int. Cl.
 *H01L 23/00* (2006.01)
 *H01L 23/48* (2006.01)
 *H01L 23/538* (2006.01)
 *H01L 29/778* (2006.01)

(52) U.S. Cl.
 CPC .......... *H01L 23/5386* (2013.01); *H01L 24/19* (2013.01); *H01L 24/20* (2013.01); *H01L 24/82* (2013.01); *H01L 29/778* (2013.01)

(58) Field of Classification Search
 CPC ................ H01L 23/5384; H01L 24/82; H01L 21/76898
 USPC ............................................... 257/368
 See application file for complete search history.

(56) References Cited

U.S. PATENT DOCUMENTS

| | | |
|---|---|---|
| 9,640,531 B1 | 5/2017 | Or-Bach et al. |
| 2007/0284612 A1 | 12/2007 | Cheng et al. |
| 2013/0078783 A1 | 3/2013 | Nieh et al. |
| 2013/0320559 A1 | 12/2013 | Huang et al. |
| 2014/0110722 A1 | 4/2014 | Kub et al. |
| 2015/0237709 A1 | 8/2015 | Mittal et al. |
| 2015/0294921 A1 | 10/2015 | Viswanathan et al. |
| 2018/0025970 A1 | 1/2018 | Kao et al. |
| 2018/0182877 A1 | 6/2018 | Lee et al. |
| 2018/0337093 A1* | 11/2018 | Chang ................ H01L 29/4175 |
| 2019/0019770 A1 | 1/2019 | Chang et al. |
| 2020/0119087 A1 | 4/2020 | Then et al. |
| 2020/0395475 A1 | 12/2020 | Bothe et al. |
| 2020/0403090 A1* | 12/2020 | Lin .................. H01L 29/41766 |

OTHER PUBLICATIONS

Notice of Allowance dated Jan. 6, 2023 for U.S. Appl. No. 17/568,881.

\* cited by examiner

SUBSTRATE LOSS REDUCTION FOR SEMICONDUCTOR DEVICES

REFERENCE TO RELATED APPLICATIONS

This application is a Continuation of U.S. application Ser. No. 17/568,881, filed on Jan. 5, 2022, which is a Divisional of U.S. application Ser. No. 17/012,490, filed on Sep. 4, 2020 (now U.S. Pat. No. 11,222,849, issued on Jan. 11, 2022), which claims the benefit of U.S. Provisional Application No. 63/014,841, filed on Apr. 24, 2020. The contents of the above-referenced patent applications are hereby incorporated by reference in their entirety.

BACKGROUND

Semiconductor devices based on silicon have been the standard for the past few decades. However, semiconductor devices based on alternative materials are receiving increasing attention for advantages over silicon-based semiconductor devices. For example, semiconductor devices based on group III-V semiconductor materials have been receiving increased attention due to high electron mobility and wide band gaps compared to silicon-based semiconductor devices. Such high electron mobility and wide band gaps allow improved performance and high temperature applications.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
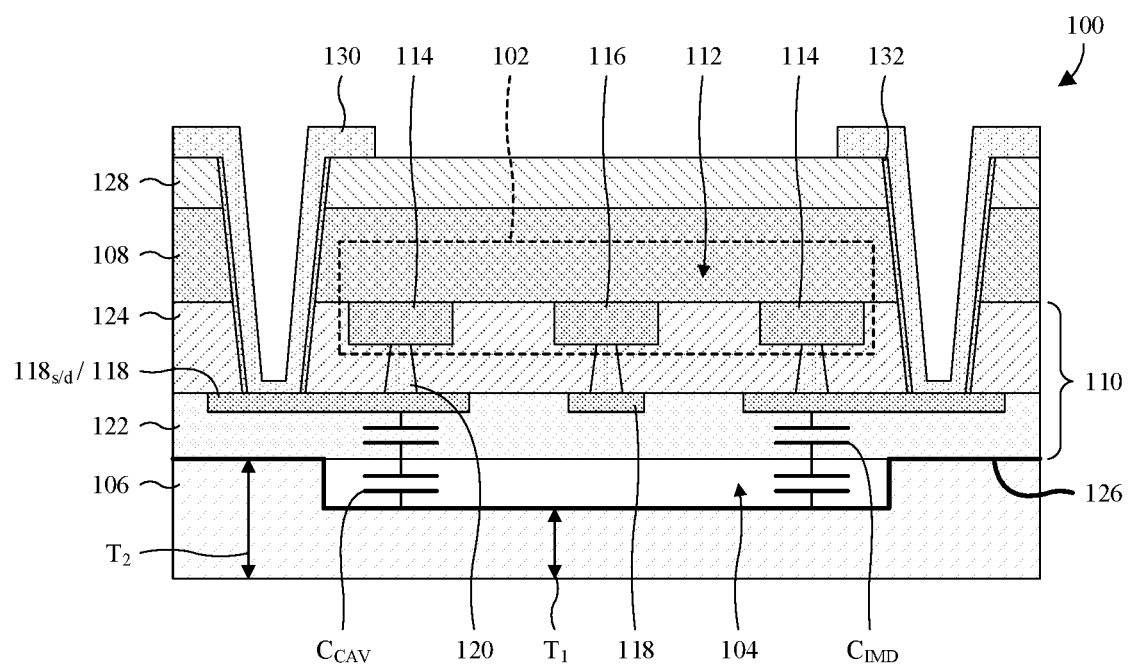
FIG. 1 illustrates a cross-sectional view of some embodiments of an integrated circuit (IC) chip comprising a semiconductor device that is inverted and overlies a cavity inset into a semiconductor substrate.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some integrated circuit (IC) chips comprise a group III-V semiconductor stack overlying and epitaxially grown on a first silicon substrate and further comprise a high-electron-mobility transistor (HEMT) overlying and formed on the group III-V semiconductor stack. However, a challenge with the IC chips is that a power added efficiency (PAE) of the HEMT may be low due to high substrate power loss. Substrate power loss may be high due to a low substrate resistance. Substrate resistance may be low due to a low silicon resistance of the first silicon substrate, a low interface resistance between the first silicon substrate and the group III-V semiconductor stack, and a high substrate capacitance from source/drain electrodes of the HEMT to the first silicon substrate. The silicon resistance may be low due to epitaxial growth of the group III-V semiconductor stack on the first silicon substrate. If the silicon resistance was high, the group III-V semiconductor stack may epitaxially grow with poor crystalline quality unsuitable for the HEMT. The interface resistance may be low due to band bending, which may induce formation of a two-dimensional hole gas (2-DHG).

To increase the PAE of the HEMT, the HEMT may be transferred to a second silicon substrate having a high resistance compared to the first silicon substrate. Particularly, an interconnect structure may be formed over and electrically coupled to the HEMT, and the second silicon substrate may be arranged over and bonded to the interconnect structure. The first silicon substrate may then be removed. By transferring the HEMT, silicon resistance may be high because the second silicon substrate has the high resistance. As such, substrate resistance may be increased and substrate power loss may be decreased. This, in turn, may increase the PAE of the HEMT. Nonetheless, the increase in the PAE of the HEMT may be marginal. For example, the improvement may be only 5% or less. The increase may be marginal because the interface resistance may still be low and/or the substrate capacitance may still be high.

Various embodiments of the present disclosure are directed towards an IC chip comprising a semiconductor device, and methods for forming the IC chip, in which the semiconductor device has a low substrate loss and a high PAE. In some embodiments of the IC chip, a semiconductor layer overlies a semiconductor substrate. The semiconductor layer may, for example, be or comprise one or more group III-V semiconductor materials and/or some other suitable semiconductor material(s). The semiconductor substrate may, for example, be or comprise silicon and/or some other suitable semiconductor material(s). An interconnect structure is between the semiconductor substrate and the semiconductor stack and comprises an intermetal dielectric (IMD) layer and source/drain pads in the IMD layer. The semiconductor device is on an underside of the semiconductor layer, between the semiconductor layer and the interconnect structure, and comprises source/drain electrodes electrically coupled respectively to the source/drain pads. The semiconductor device may, for example, be a HEMT or some other suitable type of semiconductor device. A dielectric region underlies the source/drain pads, between the semiconductor substrate and the interconnect structure, and is inset into a top of the semiconductor substrate. The dielectric region is independent of the interconnect structure and may, for example, be a cavity or a dielectric layer.

The source/drain pads capacitively couple with the semiconductor substrate, through the IMD layer, to define a substrate capacitance. Because the dielectric region underlies the source/drain pads, the capacitive coupling may also be through the dielectric region. Further, because the IMD layer and the dielectric region are independent, the substrate capacitance may be modeled as two different capacitors electrically coupled in series and respectively in the IMD layer and the dielectric region. Multiple capacitors in series yield a smaller capacitance than the capacitances of the individual capacitors, such that the dielectric region may decrease the substrate capacitance compared to what it would be without the dielectric region. Because the substrate capacitance may be decreased, substrate resistance may be increased and substrate power loss may be reduced. This may, in turn, increase PAE.

Because the dielectric region is inset into the semiconductor substrate, an interface between the semiconductor substrate and the IMD layer and between the semiconductor substrate and the dielectric region may be uneven and may hence have an increased length than if flat. Because of the increased length, interface resistance may be increased. Because of increased interface resistance, substrate resistance may be increased and substrate power loss may be decreased. This may, in turn, increase PAE.

With reference to FIG. 1, a cross-sectional view of some embodiments of an integrated circuit (IC) chip comprising a semiconductor device 102 is provided in which the semiconductor device 102 is vertically inverted and overlies a cavity 104 inset into a semiconductor substrate 106. Further, the semiconductor device 102 is on an underside of a semiconductor layer 108, which is spaced over the semiconductor substrate 106 by an interconnect structure 110. The semiconductor device 102 is a HEMT and comprises an active semiconductor region 112, a pair of source/drain electrodes 114, and a gate electrode 116.

The active semiconductor region 112 is defined by the semiconductor layer 108, and the source/drain electrodes 114 and the gate electrode 116 underlie the active semiconductor region 112. Because source/drain electrodes 114 and the gate electrode 116 underlie the active semiconductor region 112, instead of overlying the active semiconductor region 112, the semiconductor device 102 is said to be "vertically inverted". The source/drain electrodes 114 are respectively on and electrically coupled to opposite sides of the active semiconductor region 112, and the gate electrode 116 is between the source/drain electrodes 114.

The interconnect structure 110 comprises a plurality of pads 118 and a plurality of vias 120. The pads 118 are in an IMD layer 122 interfacing with the semiconductor substrate 106 and further defining a top surface of the cavity 104. The vias 120 are in an interlayer dielectric (ILD) layer 124 surrounding the source/drain electrodes 114 and the gate electrode 116 and further separating the IMD layer 122 from the semiconductor layer 108. The pads 118 are individual to and electrically coupled respectively to the source/drain electrodes 114 and the gate electrodes 116 respectively by the vias 120.

Source/drain pads 118s/a individual to and electrically coupled respectively to the source/drain electrodes 114 are capacitively coupled with the semiconductor substrate 106, through the IMD layer 122 and the cavity 104, to define individual source/drain capacitances. Further, the cavity 104 is electrically insulating, such that the source/drain capacitances may each be modeled as two capacitors that are electrically coupled in series and respectively in the IMD layer 122 and the cavity 104. For clarity, the capacitors respectively at the IMD layer 122 and the cavity 104 are respectively labeled $C_{IMD}$ and $C_{CAV}$.

Multiple capacitors in series yield a smaller capacitance than the capacitances of the individual capacitors, such that the cavity 104 may decrease the source/drain capacitances compared to what the source/drain capacitances would be without the cavity 104. For example, a source/drain capacitance may be equal to $$\frac{C_{IMD}C_{CAV}}{C_{IMD} + C_{CAV}}.$$

Therefore, supposing the IMD capacitors $C_{IMD}$ and the cavity capacitors $C_{CAV}$ are respectively 1 microfarad and 0.25 microfarad, a source/drain capacitance may achieve an 80% reduction $$\left(\text{e.g., } \frac{1*0.25}{1+0.25} = 0.2\right).$$

Note that these capacitances are non-limiting examples and other capacitances are amenable. Because the source/drain capacitances may be decreased by the cavity 104, substrate capacitance may be decreased and hence substrate resistance may be increased. Because substrate resistance may be increased, substrate power loss may be reduced. This may, in turn, increase the PAE of the semiconductor device 102. The PAE is an important parameter for, among other things, 5G mobile communications and other suitable radiofrequency (RF) applications.

As described above, the cavity 104 is electrically insulating. Hence, the cavity 104 may be regarded as a dielectric region. In some embodiments, a dielectric constant of the cavity 104 is less than that of the IMD layer 122. The lower the dielectric constant of the cavity 104, the lower the capacitances of the cavity capacitors $C_{CAV}$ and the more significant the decrease in the source/drain capacitances. Further, in some embodiments, the cavity 104 is hermetically sealed and/or filled with air or some other suitable gas.

Because the cavity 104 is inset into the semiconductor substrate 106, the semiconductor substrate 106 has a first thickness $T_1$ at a portion underlying the cavity 104 and further has a second thickness $T_2$ greater than the first thickness $T_1$ at portions laterally offset from and/or uncovered by the cavity 104. Additionally, a length of an interface 126 between the semiconductor substrate 106 and the IMD layer 122 and between the semiconductor substrate 106 and the cavity 104 is increased from a drain side of the semiconductor device 102 to a source side of the semiconductor device 102. By increasing the length, interface resistance is increased from the drain side to the source side. Because of increased interface resistance, substrate resistance may be increased and substrate power loss may be decreased. This may, in turn, increase the PAE of the semiconductor device 102.

In some embodiments, the semiconductor substrate 106 has a high resistance to further increase the PAE of the semiconductor device 102. The high resistance may, for example, be a resistance greater than about 5, 7.5, or 10 kilo-ohms/centimeter (kΩ/cm) or some other suitable resistance. Further, the high resistance may, for example, be a resistance of about 5-10 kΩ/cm, about 5-7.5 kΩ/cm, or about 7.5-10 kΩ/cm. Other suitable resistances are, however, amenable. Because of the high resistance, substrate resistance may be increased and substrate power loss may be decreased. This may, in turn, increase the PAE. The semiconductor substrate 106 may, for example, be or comprise a bulk substrate of monocrystalline silicon, a bulk substrate of silicon carbide, or some other suitable type of semiconductor substrate.

A passivation layer 128 overlies the semiconductor layer 108. The passivation layer 128 may, for example, be or comprise silicon nitride, aluminum oxide, some other suitable dielectric(s), or any combination of the foregoing.

Multiple contacts 130 extend through the passivation layer 128, the semiconductor layer 108, and the ILD layer 124 respectively to the pads 118. The contacts 130 are individual to the pads 118 and provide electrically coupling to the pads 118, and hence the source/drain electrodes 114 and the gate electrodes 116, from outside the IC chip. Further, the contacts 130 are separated from the passivation layer 128, the semiconductor layer 108, and the ILD layer 124 by individual contact liner layers 132. The contacts 130 may, for example, be or comprise aluminum copper, aluminum, some other suitable metal(s) and/or conductive material(s), or any combination of the foregoing. The contact liner layers 132 may, for example, be or comprise silicon oxide and/or some other suitable dielectric(s).

In some embodiments, the IMD layer 122 is or comprise a dielectric oxide and/or some other suitable dielectric(s). In some embodiments, the IMD layer 122 has a dielectric constant of about 3-4.2, but other suitable values are amenable. In some embodiments, a thickness of the IMD layer 122 is about 1-2 micrometers, about 1-1.5 micrometers, about 1.5-2 micrometers, or some other suitable value. In some embodiments, the ILD layer 124 is or comprise a dielectric oxide and/or some other suitable dielectric(s). In some embodiments, a thickness of the ILD layer 124 is about 2-3 micrometers, about 2-2.5 micrometers, about 2.5-3 micrometers, or some other suitable value. In some embodiments, the pads 118 and the vias 120 are metal and/or some other suitable conductive material(s).

In some embodiments, the semiconductor layer 108 is or comprises multiple individual layers. In some embodiments, the semiconductor layer 108 comprises multiple different semiconductor materials corresponding to the multiple individual layers. In alternative embodiments, the semiconductor layer 108 consists of or consists essentially of a single material. In some embodiments, the semiconductor layer 108 is or comprises a group III-V semiconductor material, a group II-VI semiconductor material, a group IV-IV semiconductor material, some other suitable semiconductor material(s), or any combination of the foregoing.

In some embodiments, the semiconductor device 102 is a depletion-mode HEMT, an enhancement-mode HEMT, a depletion-mode metal-oxide-semiconductor (MOS) HEMT, an enhancement-mode MOS HEMT, or some other suitable type of HEMT. In alternative embodiments, the semiconductor device 102 is a MOS field-effector transistor (MOSFET) or some other suitable type of semiconductor device.

Figure 2:
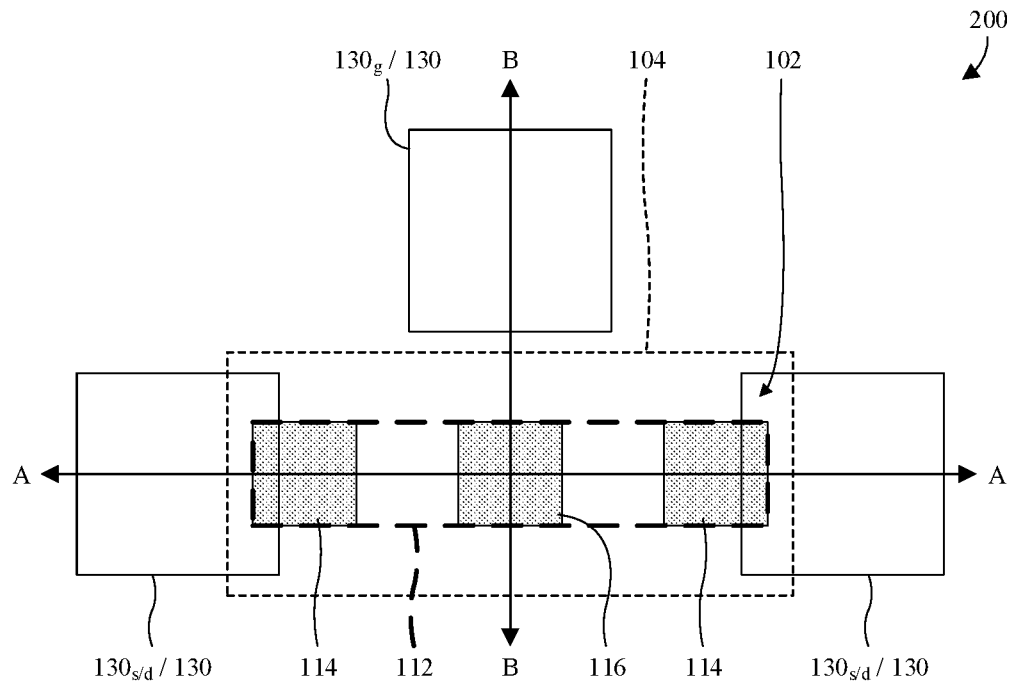
FIG. 2 illustrates a top layout view of some embodiments of the IC chip of FIG. 1.

With reference to FIG. 2, a top layout view 200 of some embodiments of the IC chip of FIG. 1 is provided. The cross-sectional view 100 of FIG. 1 may, for example, be taken along line A, but other suitable locations are amenable. The semiconductor device 102 completely overlaps with the cavity 104 (shown in phantom) so as to promote a decrease in substrate capacitance as described above. The cavity 104 has a rectangular shape, but may alternatively have a square shape, a circular shape, an oval shape, or some other suitable shape. The source/drain electrodes 114 are respectively on opposite sides of the cavity 104, and the gate electrode 116 is between the source/drain electrodes 114. Further, the active semiconductor region 112 (shown in phantom) extends between the source/drain electrodes 114.

The contacts 130 are at a periphery of the cavity 104 with source/drain contacts $130_{s/d}$ partially overlapping with the cavity 104 and a gate contact $130_g$ laterally offset from the cavity 104. Note that the gate contact $130_g$ is not visible in the cross-sectional view 100 of FIG. 1. In alternative embodiments, none of the contacts 130 overlap with the cavity 104. In alternative embodiments, all of the contacts 130 overlap with the cavity 104. In alternative embodiments, a gate contact $130_g$ partially overlaps with the cavity 104, but the source/drain contacts $130_{s/d}$ are laterally offset from the cavity 104. The gate contact $130_g$ electrically couples to the gate electrode 116. The source/drain contacts $130_{s/d}$ are each individual to and electrically coupled to a neighboring one of the source/drain electrodes 114.

Figure 3A:
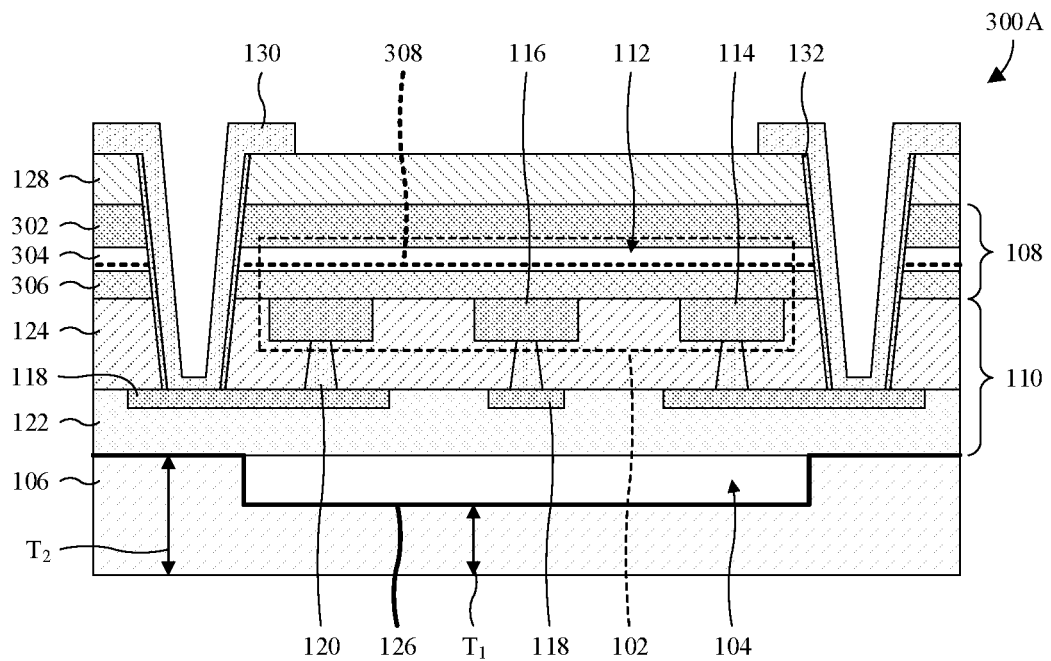
FIGS. 3A and 3B illustrate orthogonal cross-sectional views of some embodiments of the IC chip of FIG. 1 in which a semiconductor layer comprises multiple individual layers.
Figure 3B:
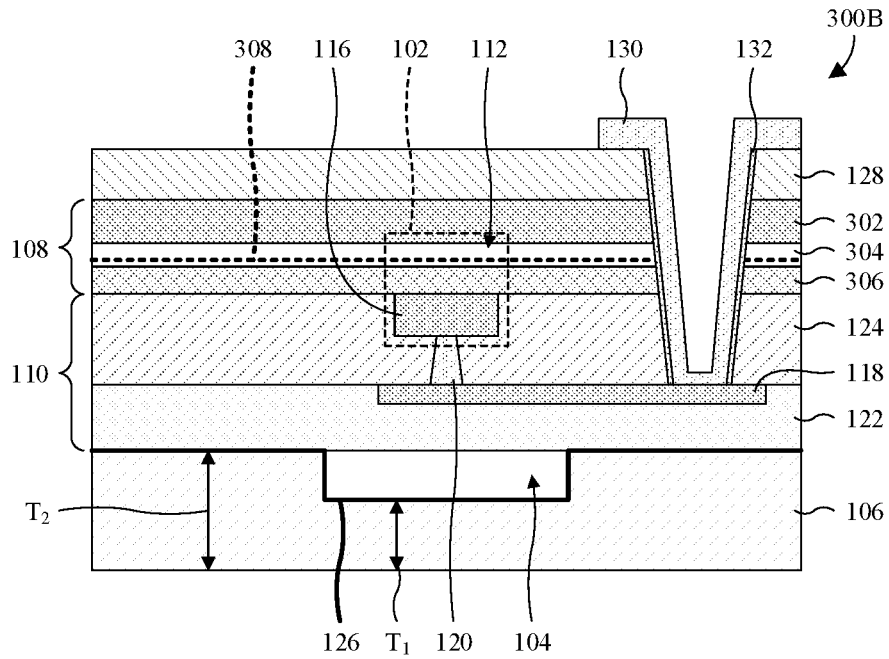

With reference to FIGS. 3A and 3B, orthogonal cross-sectional views 300A, 300B of some embodiments of the IC chip of FIG. 1 are provided in which the semiconductor layer 108 comprises multiple individual layers. In some embodiments, the IC chip has a top layout as in FIG. 2. In such embodiments, the cross-sectional view 300A of FIG. 3A may be taken along line A in FIG. 2, and the cross-sectional view 300B of FIG. 3B may be taken along line B in FIG. 2. In alternative embodiments, the IC chip has some other suitable top layout. The semiconductor layer 108 comprises a buffer layer 302, a channel layer 304 underlying the buffer layer 302, and a barrier layer 306 underlying the channel layer 304.

The buffer layer 302 compensates for differences in lattice constants, crystalline structures, thermal expansion coefficients, or any combination of the foregoing between the channel layer 304 and a semiconductor substrate (not shown) on which the semiconductor layer 108 is formed. In some embodiments, the buffer layer 302 is made up of multiple individual layers (e.g., a seed buffer, a graded buffer layer, etc.).

The barrier layer 306 is polarized so positive charge is shifted towards a top surface of the barrier layer 306, and negative charge is shifted towards a bottom surface of the barrier layer 306, or vice versa. The polarization may, for example, result from spontaneous polarization effects and/or piezoelectric polarization effects. The channel layer 304 has a band gap unequal to that of the barrier layer 306 and directly contacts the barrier layer 306. As such, the channel layer 304 directly contacts the barrier layer 306 at a heterojunction.

Because the barrier layer 306 is polarized, a two-dimensional carrier gas 308 having a high concentration of mobile carriers forms in the channel layer 304 along the heterojunction. In the event that the barrier layer 306 is polarized so positive charge is at the top surface of the barrier layer 306, the two-dimensional carrier gas 308 may be a two-dimensional electron gas (2-DEG). In the event that the barrier layer 306 is polarized so negative charge is at the top surface of the barrier layer 306, the two-dimensional carrier gas 308 may be a 2-DHG. Because of the high concentration of mobile carriers, the two-dimensional carrier gas 308 is conductive and allows the semiconductor device 102 to operate in a depletion mode.

In some embodiments, the semiconductor layer 108 is a group III-V semiconductor layer. The buffer layer 302 may, for example, be or comprise aluminum nitride, aluminum gallium nitride, some other suitable group III-V material(s), or any combination of the foregoing. The channel layer 304 may, for example, be or comprise gallium nitride and/or some other suitable group III-V material(s). The barrier layer 306 may, for example, be or comprise, for example, aluminum gallium nitride and/or some other suitable group III-V material(s). In alternative embodiments, the semiconductor layer 108 is a group II-VI semiconductor layer, a group IV-IV semiconductor layer, or some other suitable type of semiconductor layer.

Figure 4A:
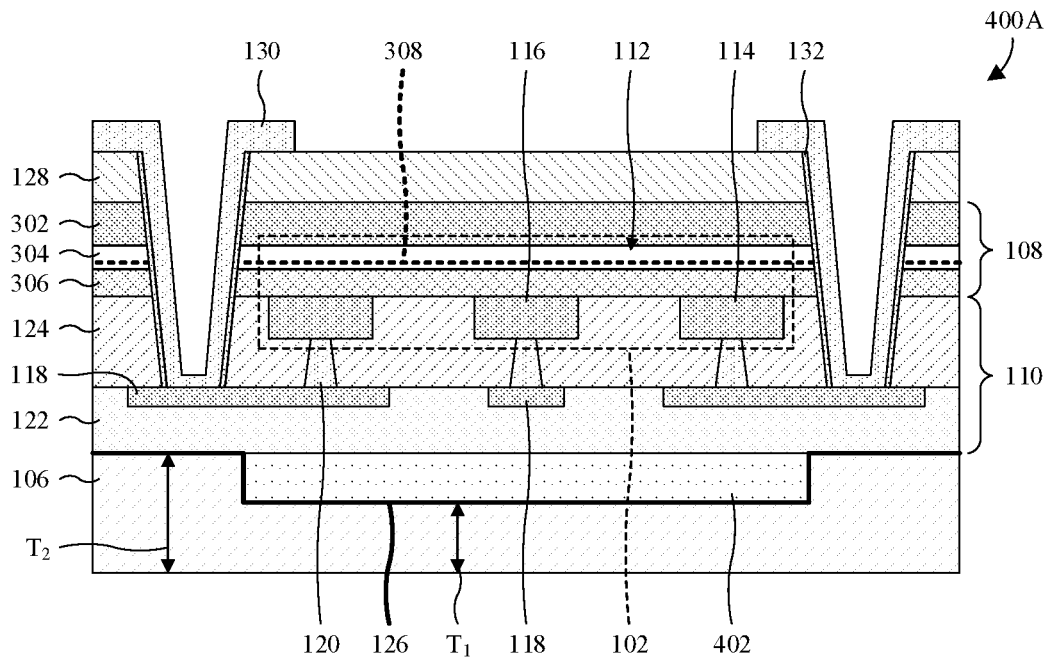
FIGS. 4A-4C illustrate cross-sectional views of some different alternative embodiments of the IC chip of FIGS. 3A and 3B in which a bottom of the cavity has recesses and/or the cavity is filled with a cavity-fill dielectric layer.
Figure 4B:
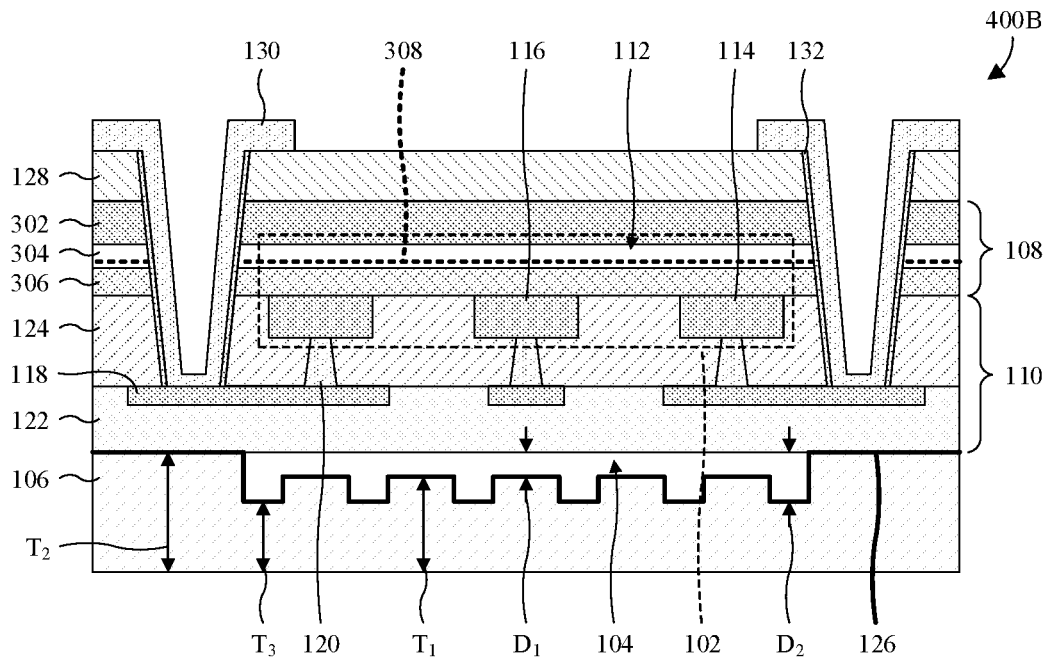
Figure 4C:
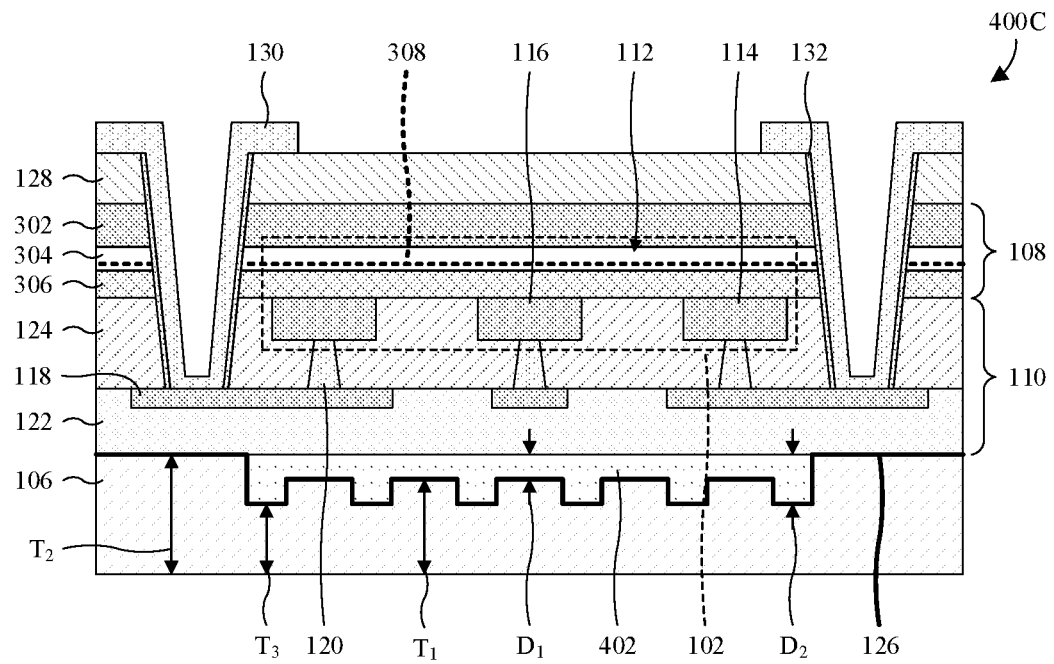

With reference to FIGS. 4A-4C, cross-sectional views 400A-400C of some different alternative embodiments of the IC chip of FIGS. 3A and 3B are provided. Note that the cross-sectional views 400A-400C of FIGS. 4A-4C correspond to the cross-sectional view 300A of FIG. 3A and hence illustrate variations to the cross-sectional view 300A of FIG. 3A.

In FIG. 4A, a cavity-fill dielectric layer 402 fills the cavity 104 to increase bond strength between the semiconductor substrate 106 and the interconnect structure 110. Further, recall that the cavity 104 introduces a capacitance in series with that of the IMD layer 122 to reduce substrate capacitance and increase substrate resistance. The cavity-fill dielectric layer 402 serves the same purpose as the cavity 104, but allows greater control over the capacitance in series with that of the IMD layer 122 since a dielectric constant of the cavity-fill dielectric layer 402 may be more readily adjusted than that of the cavity 104. Generally, the lower the capacitance of the cavity-fill dielectric layer 402, the greater the decrease in substrate capacitance and the greater the increase substrate resistance.

In some embodiments, the cavity-fill dielectric layer 402 is or comprise a dielectric oxide and/or some other suitable dielectric(s). In some embodiments, the cavity-fill dielectric layer 402 is a low k dielectric material or an extreme low k dielectric material. A low k dielectric material may, for example, be a dielectric material with a dielectric constant of about 2-3.9 or some other suitable value. On the other hand, an extreme low k dielectric material may, for example, be a dielectric material with a dielectric constant less than about 2 or some other suitable value. In some embodiments, the cavity-fill dielectric layer 402 has a lower dielectric constant than the IMD layer 122 and/or the ILD layer 124.

In FIG. 4B, the cavity 104 alternates repeatedly between a first depth $D_1$ and a second depth $D_2$ from a first side of the cavity 104 to a second side of the cavity 104 opposite the first side. In some embodiments, the cavity 104 alternates periodically between the first and second depths $D_1$, $D_2$ from the first side to the second side. In alternative embodiments, the cavity 104 alternative randomly or pseudo randomly between the first and second depths $D_1$, $D_2$ from the first side to the second side. In alternative embodiments, the cavity 104 alternates between more than two depths from the first side to the second side.

Because the cavity 104 alternates between the first and second depths $D_1$, $D_2$ from the first side of the cavity 104 to the second side of the cavity 104, the semiconductor substrate 106 alternates between a first thickness $T_1$ and a third thickness $T_3$ less than the first thickness $T_1$ from the first side to the second side. Further, a bottom profile of the cavity 104 is uneven and has a plurality of upward protrusions or downward recesses depending on how one views it. As such, a length of the interface 126 between the semiconductor substrate 106 and the IMD layer 122 and between the semiconductor substrate 106 and the cavity 104 is increased from a drain side of the semiconductor device 102 to a source side of the semiconductor device 102. By increasing the length, interface resistance is increased from the drain side to the source side. Because of increased interface resistance, substrate resistance may be increased and substrate power loss may be decreased. This may, in turn, increase PAE.

In FIG. 4C, the cavity 104 is as in FIG. 4B and is filled by the cavity-fill dielectric layer 402 as in FIG. 4A. Because the cavity 104 is as in FIG. 4B, the length of the interface 126 is increased and hence substrate resistance is increased. Because the cavity 104 is filled by the cavity-fill dielectric layer 402 as in FIG. 4A, bond strength between the semiconductor substrate 106 and the interconnect structure 110 is increased. Further, the capacitance of the dielectric region at the cavity 104 may be better controlled. As explained above, this allows better control over substrate capacitance and hence better control over substrate resistance.

While the cross-sectional views 400A-400C of FIGS. 4A-4C illustrate variations to the cross-sectional view 300A of FIG. 3A, the variations may be applied to the cross-sectional view 300B of FIG. 3B. For example, the cavity 104 of FIG. 3B may be filled with the cavity-fill dielectric layer 402 as illustrated in FIGS. 4A and 4C.

Figure 5A:
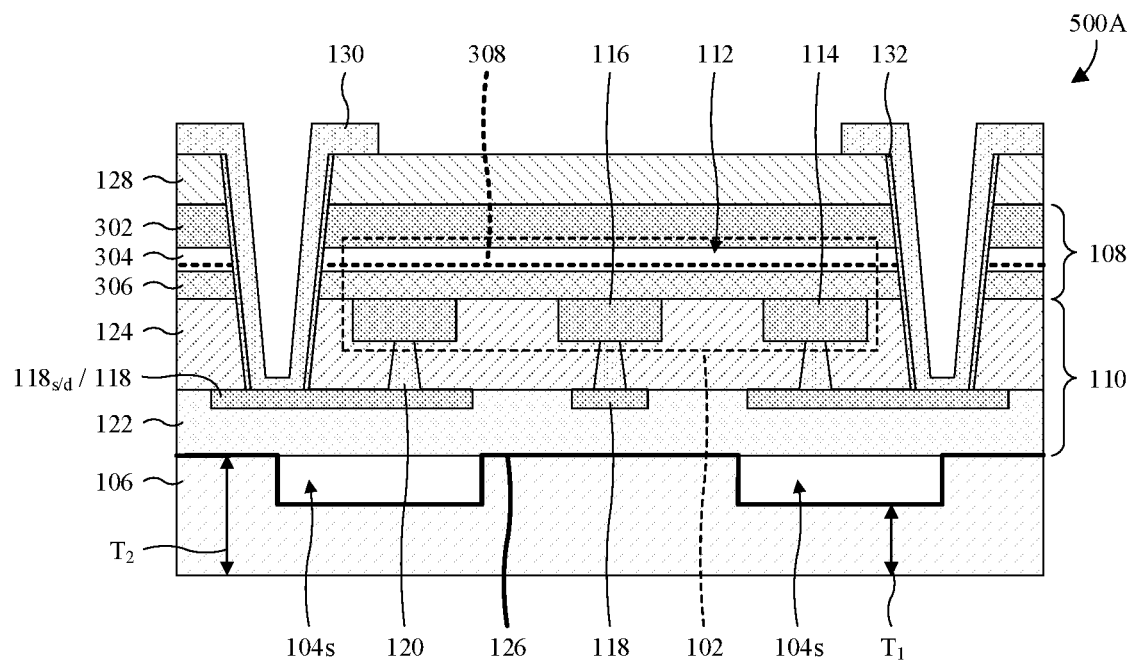
FIGS. 5A and 5B illustrate orthogonal cross-sectional views of some alternative embodiments of the IC chip of FIGS. 3A and 3B in which multiple small cavities replace the cavity.
Figure 5B:
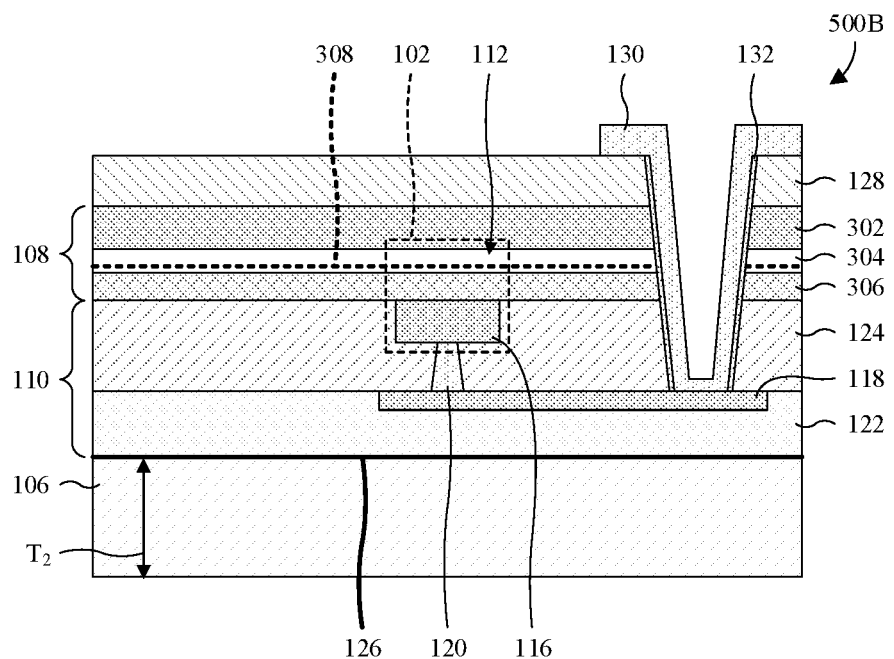

With reference to FIGS. 5A and 5B, orthogonal cross-sectional views 500A, 500B of some alternative embodiments of the IC chip of FIGS. 3A and 3B are provided in which the cavity 104 is replaced with multiple small cavities 104s. The small cavities 104s are individual to and respectively underlie the source/drain electrodes 114. Further, the small cavities 104s are individual to and respectively underlie the source/drain pads 118$_{s/d}$. The small cavities 104s may, for example, each be as the cavity 104 of FIGS. 3A and 3B is described except for the smaller size.

The small cavities 104s increase the bond area between the semiconductor substrate 106 and the interconnect structure 110. This increases the bond strength and reduces the likelihood of IC chip mechanically failing along the bond interface. Additionally, the small cavities 104s reduce source/drain capacitance from the source/drain pads 118sid to the semiconductor substrate 106 in the same manner as the cavity 104. As such, the small cavities reduce substrate capacitance, increase substrate resistance, and decrease substrate power loss. This, in turn, increases the PAE of the semiconductor device 102. In some embodiments, the small cavities 104s further reduce capacitive coupling between the second semiconductor substrate 106 and the source/drain pads 118$_{s/d}$ as compared to FIGS. 3A and 3B. By reducing capacitive coupling, the source/drain capacitance is further reduced and PAE is further increased.

Figure 6:
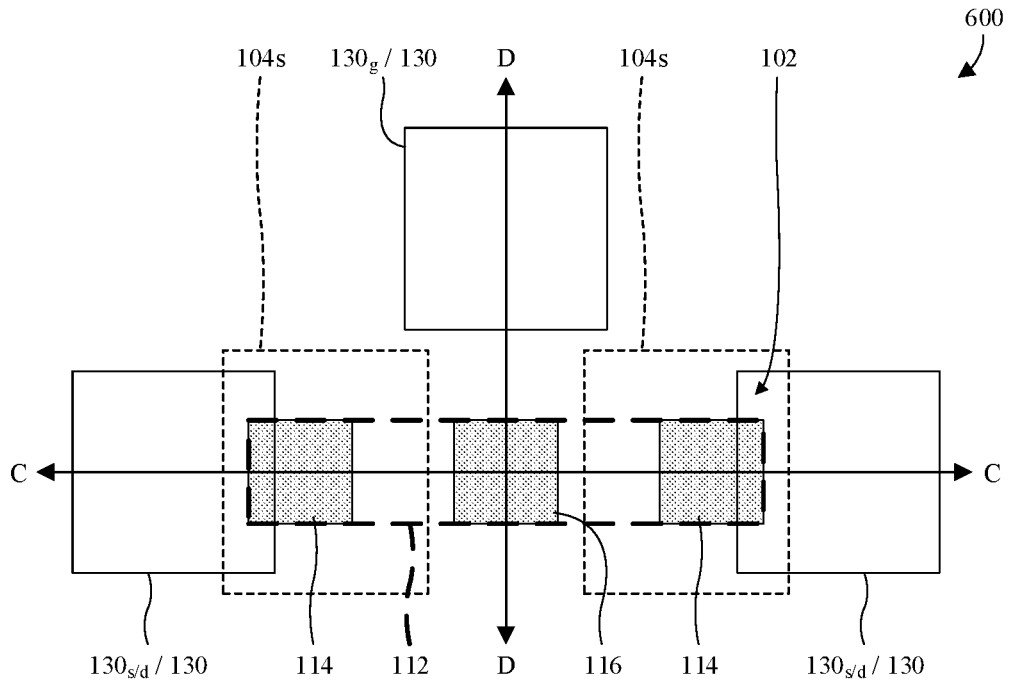
FIG. 6 illustrates a top layout view of some embodiments of the IC chip of FIGS. 5A and 5B.

With reference to FIG. 6, a top layout view 600 of some embodiments of the IC chip of FIGS. 5A and 5B is provided. The cross-sectional view 500A of FIG. 5A may, for example, be taken along line C, but other suitable locations are amenable. Further, the cross-sectional view 500B of FIG. 5B may, for example, be taken along line D, but other suitable locations are amenable. The top layout view 600 is as described at FIG. 2, except that the cavity 104 has been replaced by the multiple small cavities 104s (shown in phantom).

Figure 7A:
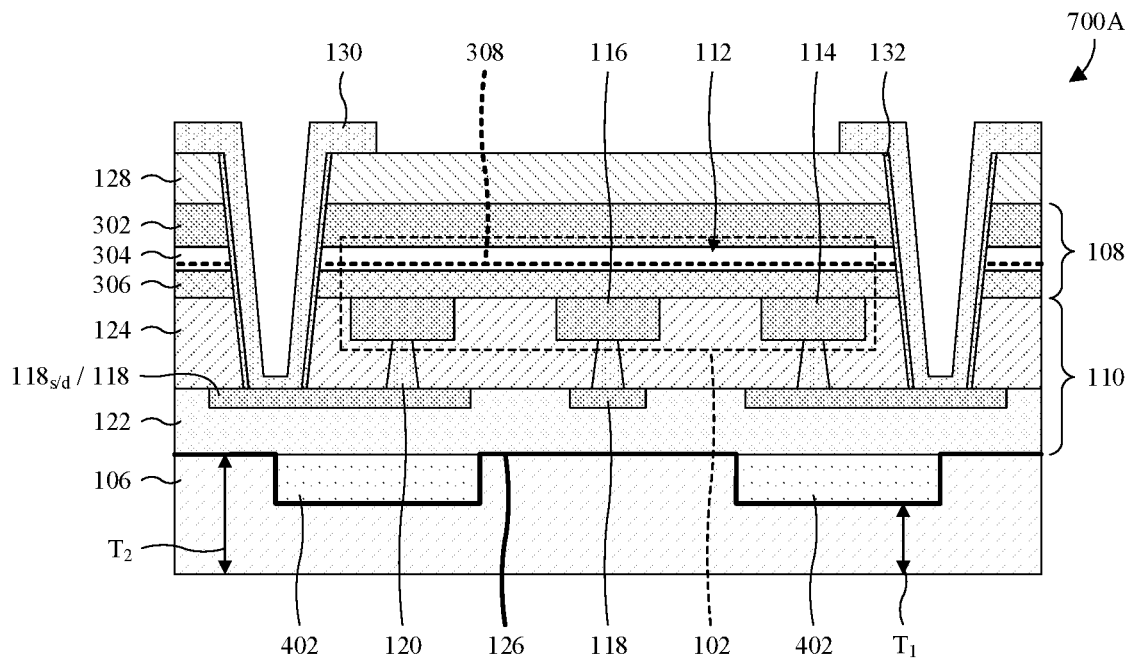
FIGS. 7A-7C illustrate cross-sectional views of some different alternative embodiments of the IC chip of FIGS. 5A and 5B in which bottoms of the cavities have recesses and/or the cavities are filled with a cavity-fill dielectric layer.
Figure 7B:
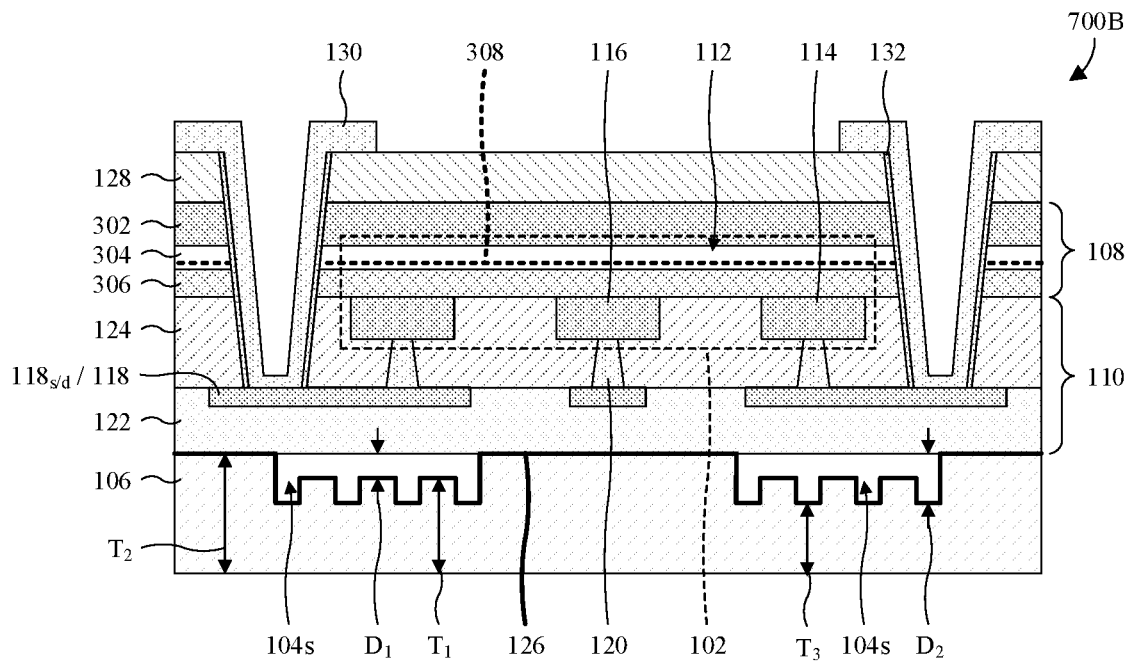
Figure 7C:
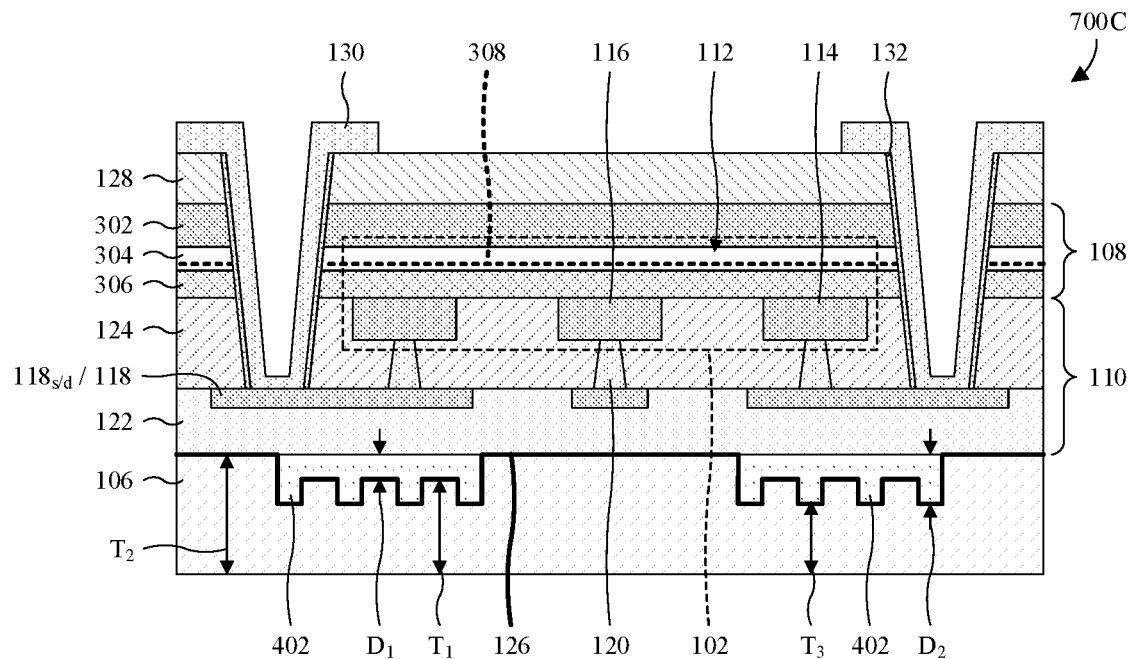

With reference to FIGS. 7A-7C, cross-sectional views 700A-700C of some different alternative embodiments of the IC chip of FIGS. 5A and 5B are provided. Note that the cross-sectional views 700A-700C of FIGS. 7A-7C correspond to the cross-sectional view 500A of FIG. 5A and hence illustrate variations to the cross-sectional view 500A of FIG. 5A. FIG. 5B is the same for embodiments of the IC chip in FIGS. 7A-7C.

In FIG. 7A, the cavity-fill dielectric layer 402 fills the small cavities 104s to increase bond strength between the semiconductor substrate 106 and the interconnect structure 110. Further, as described with regard to FIG. 4A, the cavity-fill dielectric layer 402 allows better control over the dielectric constant at the small cavities 104s, which allows better control over substrate capacitance and hence substrate resistance.

In FIG. 7B, each small cavity 104s alternates repeatedly between a first depth $D_1$ and a second depth $D_2$ from a first side of the small cavity to a second side of the small cavity opposite the first side as described with regard to FIG. 4B. Further, a thickness of the semiconductor substrate 106 alternates between a first thickness $T_1$ and a third thickness $T_3$ at each small cavity 104s. Accordingly, a length of the interface 126 between the semiconductor substrate 106 and the IMD layer 122 and between the semiconductor substrate 106 and the small cavities 104s is increased from a drain side of the semiconductor device 102 to a source side of the semiconductor device 102. By increasing the length, substrate resistance may be increased and substrate power loss may be decreased.

In FIG. 7C, the small cavities 104s are as in FIG. 7B and are filled by the cavity-fill dielectric layer 402 as in FIG. 7A. Because the small cavities 104s are as in FIG. 7B, the length of the interface 126 is increased and hence substrate resistance is increased. Because the small cavities 104s are filled by the cavity-fill dielectric layer 402 as in FIG. 7A, bond strength between the semiconductor substrate 106 and the interconnect structure 110 is increased. Further, the capacitance of the dielectric regions at the small cavities 104s may be better controlled.

With reference to FIGS. 8A-8D, cross-sectional views 800A-800D of some different alternative embodiments of the semiconductor device 102 of FIGS. 3A and 3B is provided.

Figure 8A:
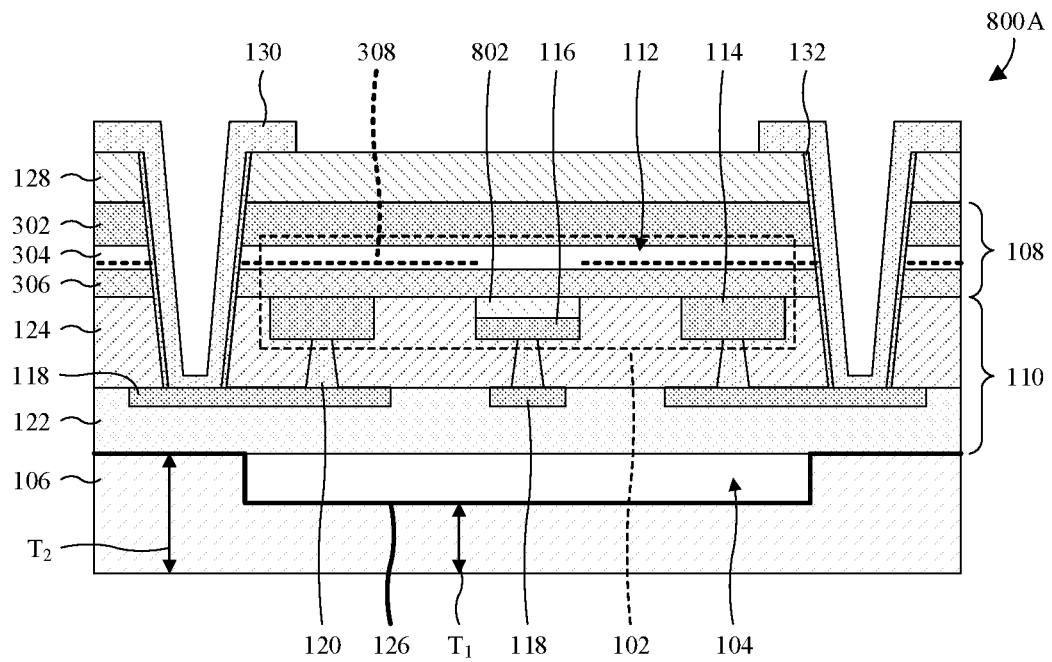
FIGS. 8A-8D illustrate cross-sectional views of some different alternative embodiments of the semiconductor device of FIGS. 3A and 3B.

In FIG. 8A, a cap layer 802 is localized between the gate electrode 116 and the semiconductor layer 108. Further, the cap layer 802 disperses mobile carriers that overlie the cap layer 802 in the two-dimensional carrier gas 308. As such, the two-dimensional carrier gas 308 is discontinuous at the cap layer 802 in the absence of an external electric field (e.g., applied by the gate electrode 116) and the semiconductor device 102 may operate in an enhancement mode. The dispersion may, for example, result from polarization of the cap layer 802, doping of the cap layer 802, or some other suitable property of the cap layer 802. In some embodiments, the cap layer 802 is or comprises a doped group III-V semiconductor material. For example, the cap layer 802 may be or comprise doped gallium nitride. In alternative embodiments, the cap layer 802 is or comprises some other suitable type of semiconductor material.

Figure 8B:
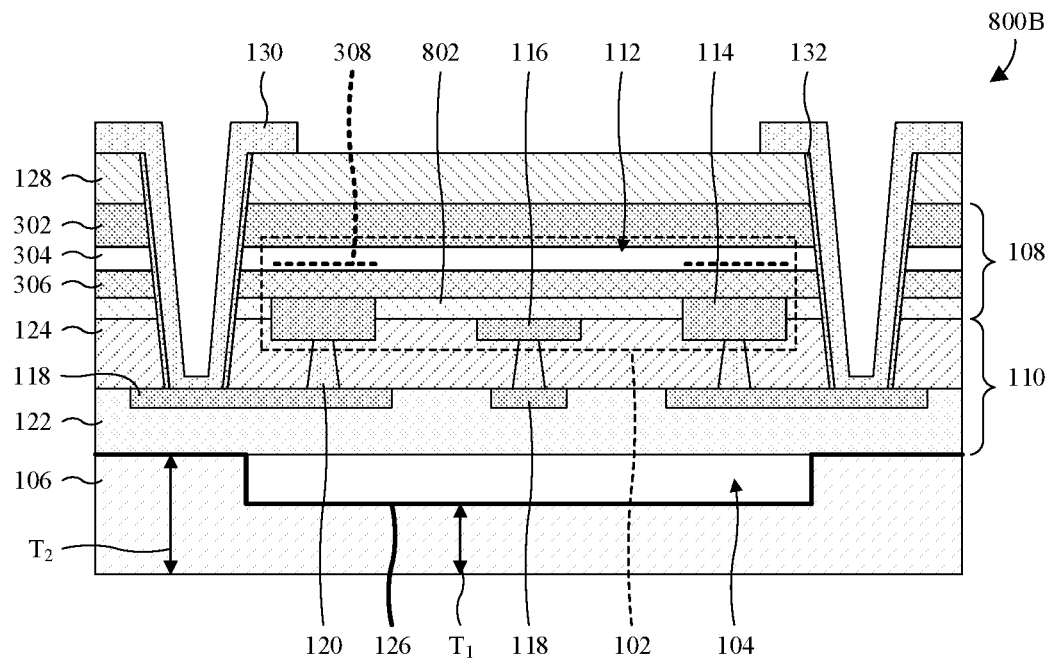

In FIG. 8B, the cap layer 802 is as in FIG. 8A, except that the cap layer 802 blankets the barrier layer 306. Further, the contacts 130 and the source/drain electrodes 114 extend through the cap layer 802. As such, the two-dimensional carrier gas 308 is localized above the source/drain electrodes 114 in the absence of an external electric field and the semiconductor device 102 may operate in an enhancement mode.

Figure 8C:
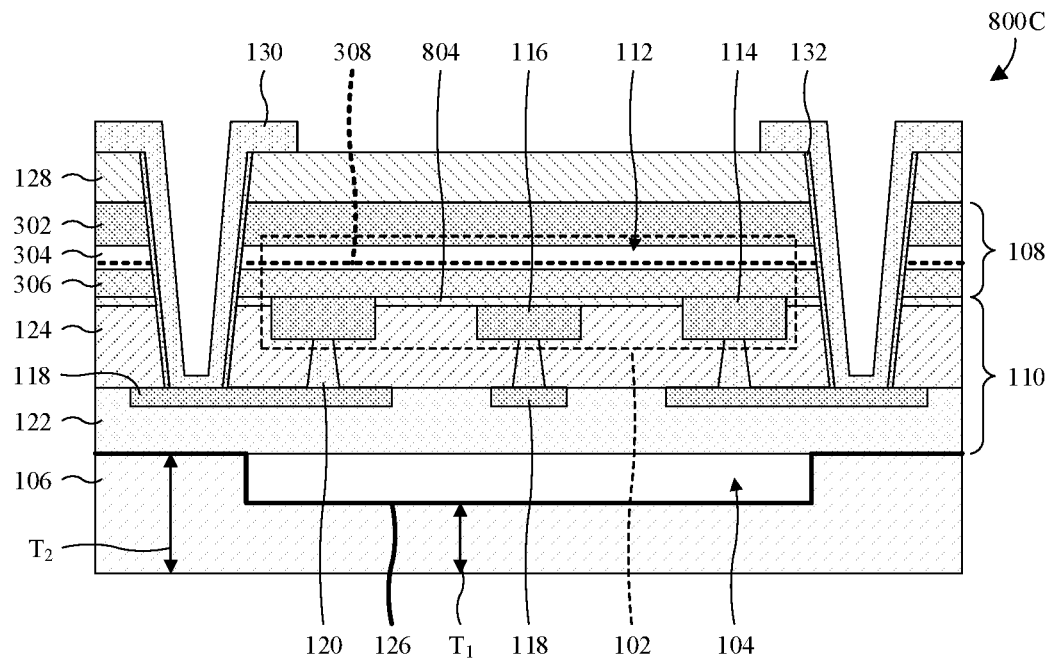

In FIG. 8C, a gate dielectric layer 804 separates the gate electrode 116 from the barrier layer 306. As such, the semiconductor device 102 may be a MOS HEMT operating in depletion mode. The gate dielectric layer 804 may, for example, be or comprise aluminum oxide, silicon oxide, some other suitable dielectric(s), or any combination of the foregoing.

Figure 8D:
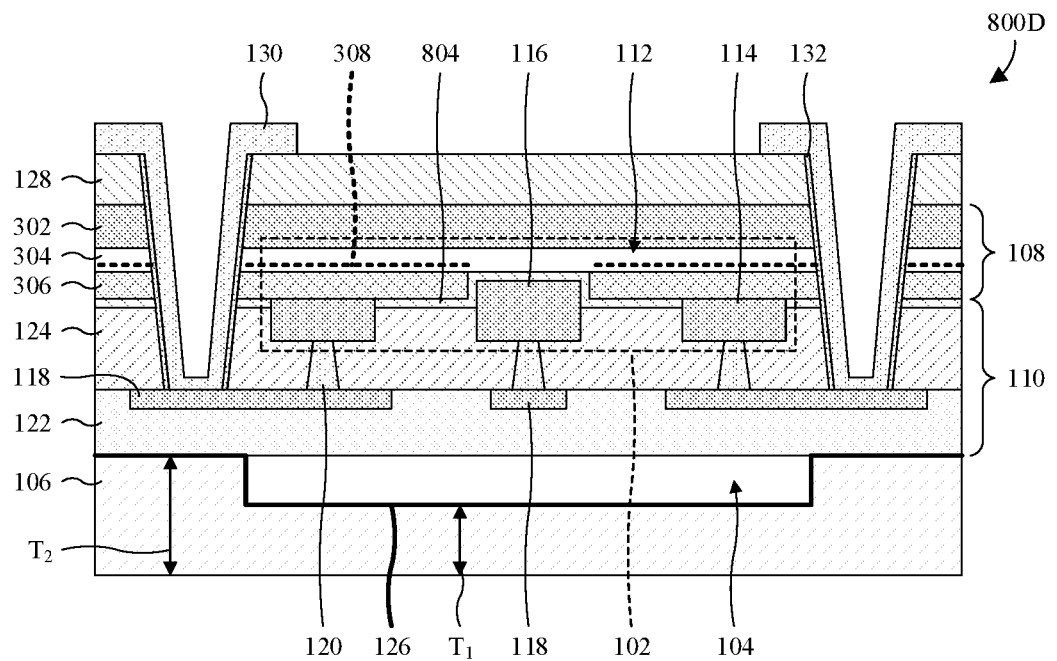

In FIG. 8D, the gate dielectric layer 804 separates the gate electrode 116 from the barrier layer 306 and the channel layer 304. Further, the gate dielectric layer 804 and the gate electrode 116 extend through the barrier layer 306. As such, the two-dimensional carrier gas 308 is discontinuous at the gate electrode 116 in the absence of an external electric field and the semiconductor device 102 may be a MOS HEMT operating in an enhancement mode.

While FIGS. 8A-8D illustrate different embodiments of the semiconductor device 102 using embodiments of the IC chip in FIGS. 3A and 3B, the different embodiments of the semiconductor device 102 are also applicable to embodiments of the IC chip in any of FIGS. 4A-4C, 5A, 5B, and 7A-7C. In other words, the semiconductor device 102 in any of FIGS. 4A-4C, 5A, 5B, and 7A-7C may be replaced by the semiconductor device 102 in any of FIGS. 8A-8D.

With reference to FIGS. 9, 10, 11A, 11B, and 12-18, a series of cross-sectional views 900, 1000, 1100A, 1100B, 1200-1800 of some embodiments of a method for forming an IC chip is provided in which a semiconductor device is inverted and overlies at least one cavity inset into a semiconductor substrate. The method may, for example, be employed to form the IC chip of FIGS. 3A and 3B, the IC chip of FIGS. 5A and 5B, or some other suitable IC chip.

Figure 9:
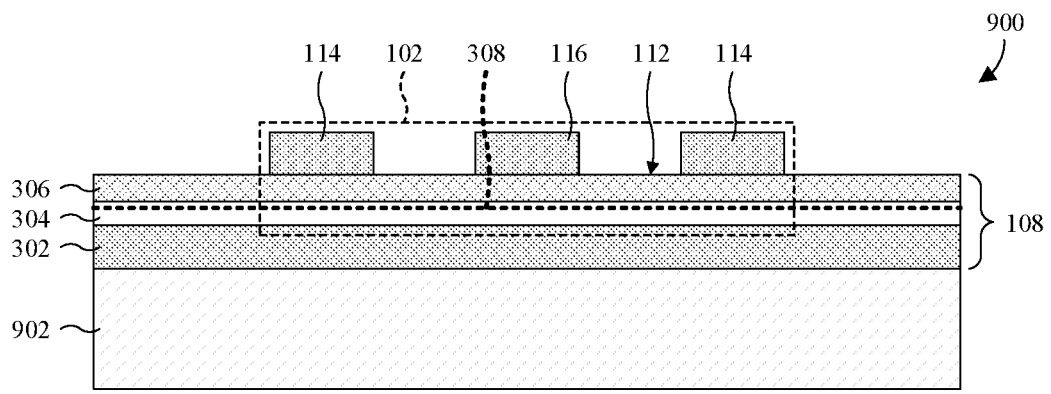
FIGS. 9, 10, 11A, 11B, and 12-18 illustrate a series of cross-sectional views of some embodiments of a method for forming an IC chip comprising a semiconductor device that is inverted and overlies at least one cavity inset into a semiconductor substrate.

As illustrated by the cross-sectional view 900 of FIG. 9, a semiconductor layer 108 is epitaxially deposited over a first semiconductor substrate 902. The semiconductor layer 108 comprises a buffer layer 302, a channel layer 304 overlying the buffer layer 302, and a barrier layer 306 overlying the channel layer 304. In alternative embodiments, the semiconductor layer 108 has some other suitable composition. The semiconductor layer 108 varies depending upon a semiconductor device hereafter formed on the semiconductor layer 108.

The buffer layer 302 compensates for differences in lattice constants, crystalline structures, thermal expansion coefficients, or any combination of the foregoing between the channel layer 304 and the first semiconductor substrate 902. In some embodiments, the buffer layer 302 is made up of multiple individual layers that are not individually shown. The barrier layer 306 is polarized so positive charge is shifted towards a top surface of the barrier layer 306, and negative charge is shifted towards a bottom surface of the barrier layer 306, or vice versa. The channel layer 304 has a band gap unequal to that of the barrier layer 306 and directly contacts the barrier layer 306 at a heterojunction. Because the barrier layer 306 is polarized, a two-dimensional carrier gas 308 (e.g., a 2-DHG or a 2-DEG) having a high concentration of mobile carriers forms in the channel layer 304 along the heterojunction.

The semiconductor layer 108 may, for example, be or comprise one or more group III-V semiconductor materials, one or more group II-VI semiconductor materials, one or more group IV-IV semiconductor materials, or some other suitable type(s) of semiconductor material. In some embodiments in which the semiconductor layer 108 is or comprises group III-V semiconductor material(s), the buffer layer 302 is or comprises aluminum nitride, aluminum gallium nitride, some other suitable group III-V material(s), or any combination of the foregoing. In some embodiments in which the semiconductor layer 108 is or comprises group III-V semiconductor material(s), the channel layer 304 is or comprise gallium nitride and/or some other suitable group III-V material(s). In some embodiments in which the semiconductor layer 108 is or comprises group III-V semiconductor material(s), the barrier layer 306 is or comprise aluminum gallium nitride and/or some other suitable group III-V material(s).

The first semiconductor substrate 902 may, for example, be or comprise a bulk substrate of monocrystalline silicon, a bulk substrate of silicon carbide, or some other suitable type of semiconductor substrate. In some embodiments, the first semiconductor substrate 902 has a low resistance. The low resistance may, for example, be a resistance less than about 1 kΩ/cm, 1.5 Ω/cm, 2 Ω/cm, or some other suitable resistance. Further, the low resistance may, for example, be a resistance of about 1-1.5 kΩ/cm or about 1.5-2 kΩ/cm. Other suitable resistances are, however, amenable. If the first semiconductor substrate 902 has a high resistance, the semiconductor layer 108 may be epitaxially deposited with poor crystalline quality unsuitable for a semiconductor device 102 hereafter formed.

Also illustrated by the cross-sectional view 900 of FIG. 9, the semiconductor device 102 is formed on the semiconductor layer 108. The semiconductor device 102 is a depletion-mode HEMT, but may alternatively be an enhancement-mode HEMT, a depletion-mode MOS HEMT, an enhancement-mode MOS HEMT, or some other suitable type of HEMT. Non-limiting examples of these alternatives are as illustrated and described at FIGS. 8A-8D. In alternative embodiments, the semiconductor device 102 is a MOSFET or some other suitable type of semiconductor device other than a HEMT.

The semiconductor device 102 comprises an active semiconductor region 112, a pair of source/drain electrodes 114, and a gate electrode 116. The active semiconductor region 112 is defined by the semiconductor layer 108, and the source/drain electrodes 114 and the gate electrode 116 overlie the active semiconductor region 112. The source/drain electrodes 114 are respectively on and electrically coupled to opposite sides of the active semiconductor region 112, and the gate electrode 116 is between the source/drain electrodes 114. In some embodiments, the semiconductor device 102 has a top layout as in FIG. 2 and/or FIG. 6.

Figure 10:
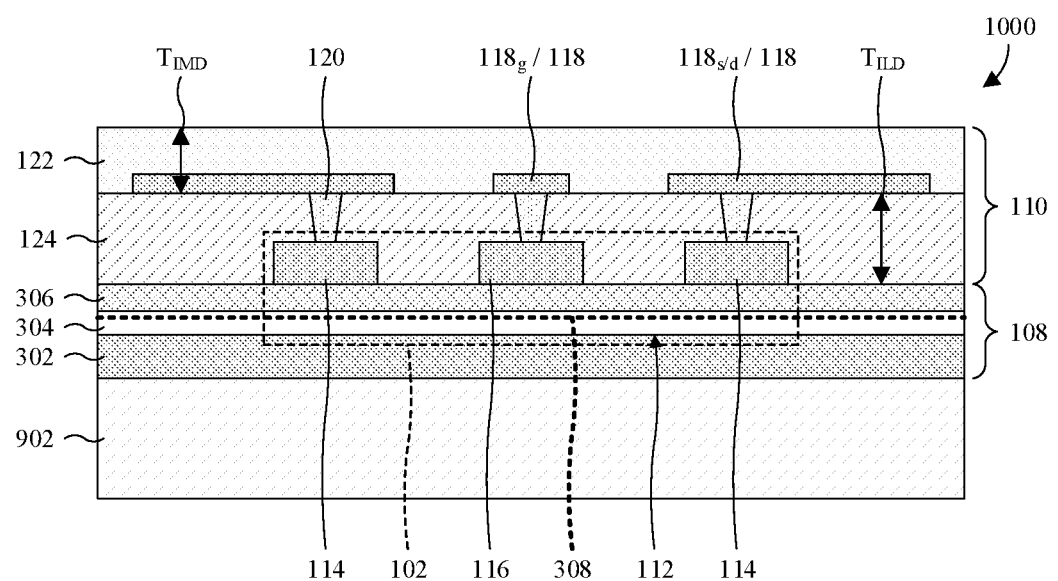

As illustrated by the cross-sectional view 1000 of FIG. 10, an interconnect structure 110 is formed over and electrically coupled to the semiconductor device 102. The interconnect structure 110 comprises a plurality of pads 118 and a plurality of vias 120. The pads 118 are in an IMD layer 122 and are individual to and electrically coupled respectively to the source/drain electrodes 114 and the gate electrodes 116 respectively by the vias 120. The pads 118 comprise source/drain pads 118s/a corresponding to the source/drain electrodes 114 and further comprise a gate pad 118g corresponding to the gate electrode 116. In some embodiments, the pads 118 have a top layout as in FIG. 2 and/or FIG. 6, but other suitable top layouts are amenable. In alternative embodiments, the gate pad 118g is not be visible in the cross-sectional view 1000. The vias 120 are in an ILD layer 124 surrounding the source/drain electrodes 114 and the gate electrode 116 and further separating the IMD layer 122 from the semiconductor layer 108.

In some embodiments, the IMD layer 122 is or comprise a dielectric oxide and/or some other suitable dielectric(s). In some embodiments, the IMD layer 122 has a dielectric constant of about 3-4.2, but other suitable values are amenable. In some embodiments, a thickness $T_{IMD}$ of the IMD layer 122 is about 1-2 micrometers, about 1-1.5 micrometers, about 1.5-2 micrometers, or some other suitable value. In some embodiments, the ILD layer 124 is or comprise a dielectric oxide and/or some other suitable dielectric(s). In some embodiments, a thickness $T_{ILD}$ of the ILD layer 124 is about 2-3 micrometers, about 2-2.5 micrometers, about 2.5-3 micrometers, or some other suitable value.

Figure 11A:
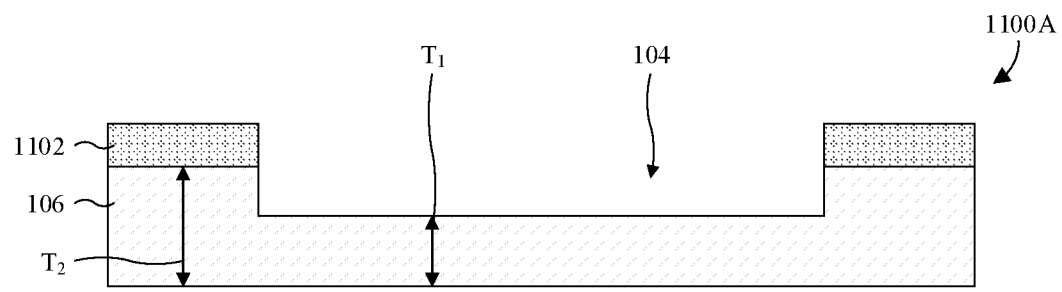

As illustrated by the cross-sectional view 1100A of FIG. 11A, a second semiconductor substrate 106 is patterned to form a cavity 104. As seen hereafter, the second semiconductor substrate 106 is subsequently arranged over and bonded to the structure of FIG. 10. The cavity 104 is sized and oriented so that upon completion of the bonding, the cavity 104 overlaps with the semiconductor device 102 and, more specifically, the source/drain pads $118_{s/d}$ when viewed top down. This may help reduce substrate capacitance as described in detail hereafter.

Because of the cavity 104, the second semiconductor substrate 106 has a first thickness $T_1$ at a portion underlying the cavity 104. Further, the second semiconductor substrate 106 has a second thickness $T_2$ greater than the first thickness $T_1$ at portions laterally offset from the cavity 104. In some embodiments, the second thickness $T_2$ is about 950-1050 micrometers, about 950-1000 micrometers, about 1000-1050 micrometers, or some other suitable value.

In some embodiments, the second semiconductor substrate 106 has a high resistance compared to the first semiconductor substrate 902 (see, e.g., FIG. 10). As seen hereafter, the semiconductor device 102 is subsequently transferred to the second semiconductor substrate 106. The high resistance reduces substrate losses and increases the PAE of the semiconductor device 102. The high resistance may, for example, be a resistance greater than about 5 Ω/cm, 7.5 kΩ/cm, 10 kΩ/cm, or some other suitable resistance. Further, the high resistance may, for example, be a resistance of about 5-10 kΩ/cm, about 5-7.5 kΩ/cm, or about 7.5-10 kΩ/cm. Other suitable resistances are, however, amenable.

The patterning may, for example, comprise: 1) forming a mask 1102 over the second semiconductor substrate 106; 2) etching the second semiconductor substrate 106 with the mask 1102 in place to form the cavity 104; 3) and removing the mask 1102. Other suitable processes for the patterning are, however, amenable. The mask 1102 may, for example, be a photoresist mask formed by photolithography or some other suitable type of mask. The etching may, for example, be performed by dry etching, but other suitable types of etching are amenable.

Figure 11B:
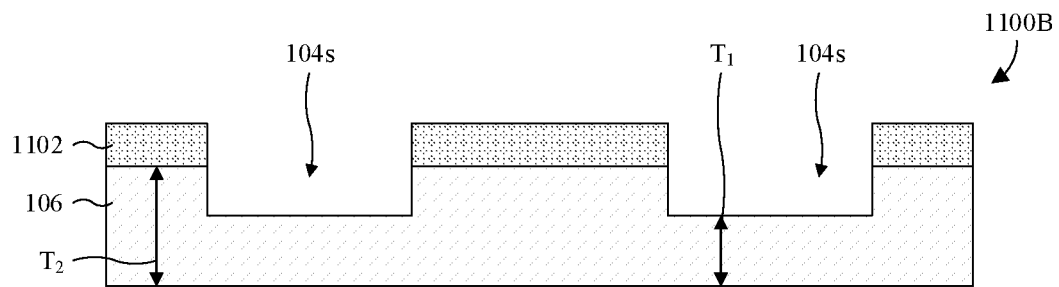

As illustrated by the cross-sectional view 1100B of FIG. 11B, the second semiconductor substrate 106 is alternatively patterned to form multiple small cavities 104s. As seen hereafter and mentioned above, the second semiconductor substrate 106 is subsequently arranged over and bonded to the structure of FIG. 10. The small cavities 104s are sized and oriented so that upon completion of the bonding, the small cavities 104s overlap with the semiconductor device 102 when viewed top down and, more specifically, respectively overlap with the source/drain pads 118$_{s/d}$ when viewed top down. This may help reduce substrate capacitance as described in detail hereafter. Additionally, the small cavities increase bond area between the second semiconductor substrate 106 and the structure of FIG. 10 during the bonding. This increases the bond strength and reduces the likelihood of IC chip mechanically failing along the bond interface. The second semiconductor substrate 106 and the patterning may, for example, be as described with regard to FIG. 11A.

Figure 12:
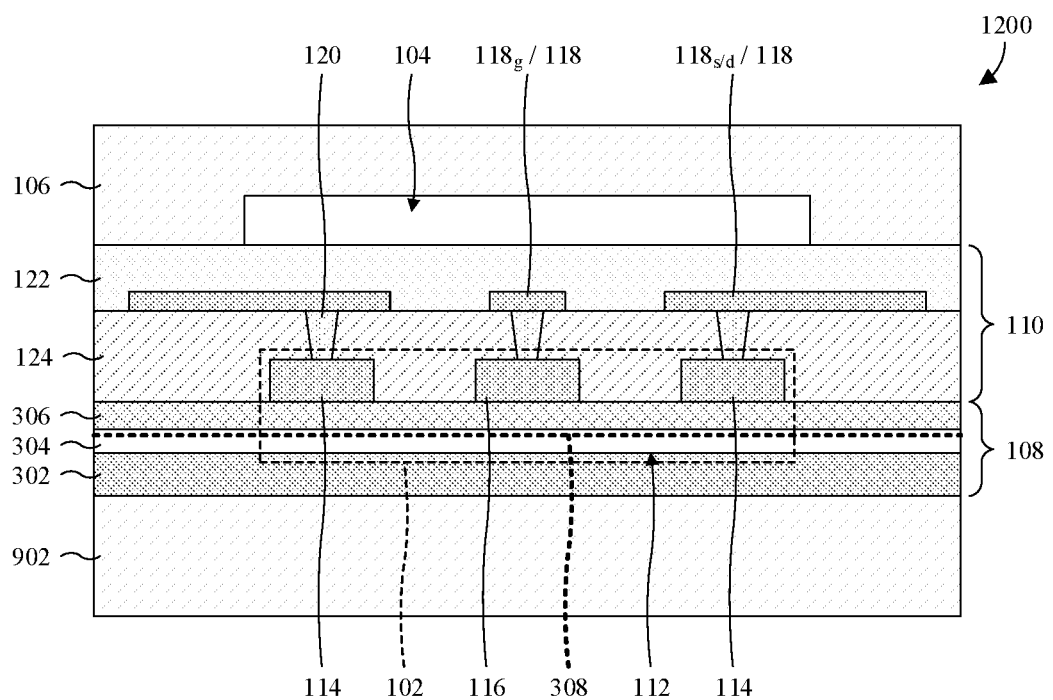

As illustrated by the cross-sectional view 1200 of FIG. 12, the second semiconductor substrate 106 is flipped vertically and is arranged over and bonded to the interconnect structure 110. In some embodiments, the cavity 104 is hermetically sealed and/or filled with air or some other suitable gas. As noted above, FIGS. 11A and 11B are alternatives of each other. FIG. 12 illustrates the method proceeding from FIG. 11A, while skipping FIG. 11B, and hence uses embodiments of the second semiconductor substrate 106 in FIG. 11A. In alternative embodiments, the method proceeds from FIG. 11B, while skipping FIG. 11A, and hence uses embodiments of the second semiconductor substrate 106 in FIG. 11B. The bonding may, for example, be performed by fusion bonding or by some other suitable type of bonding.

Figure 13:
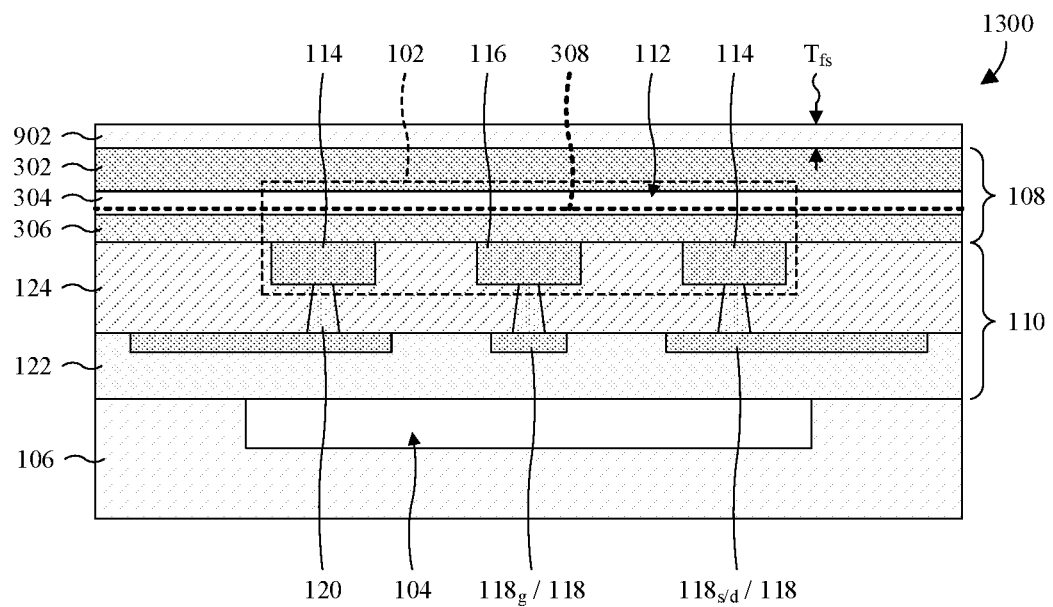

As illustrated by the cross-sectional view 1300 of FIG. 13, the structure of FIG. 12 is flipped vertically and the first semiconductor substrate 902 is thinned to reduce a thickness $T_{fs}$ of the first semiconductor substrate 902. In some embodiments, the thickness $T_{fs}$ is reduced to about 4 micrometers, about 3-5 micrometers, or some other suitable value. The thinning may, for example, be performed by mechanical grinding, a chemical mechanical planarization (CMP), or some other suitable thinning process.

Figure 14:
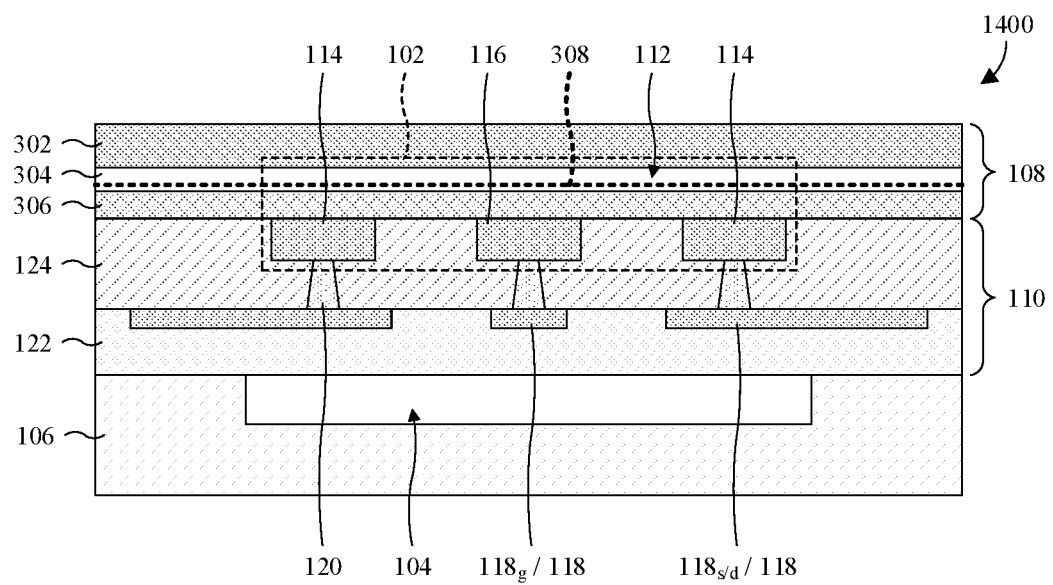

As illustrated by the cross-sectional view 1400 of FIG. 14, a remainder of the first semiconductor substrate 902 is removed. The removal may, for example, be performed by etching or by some other suitable type of removal process.

Figure 15:
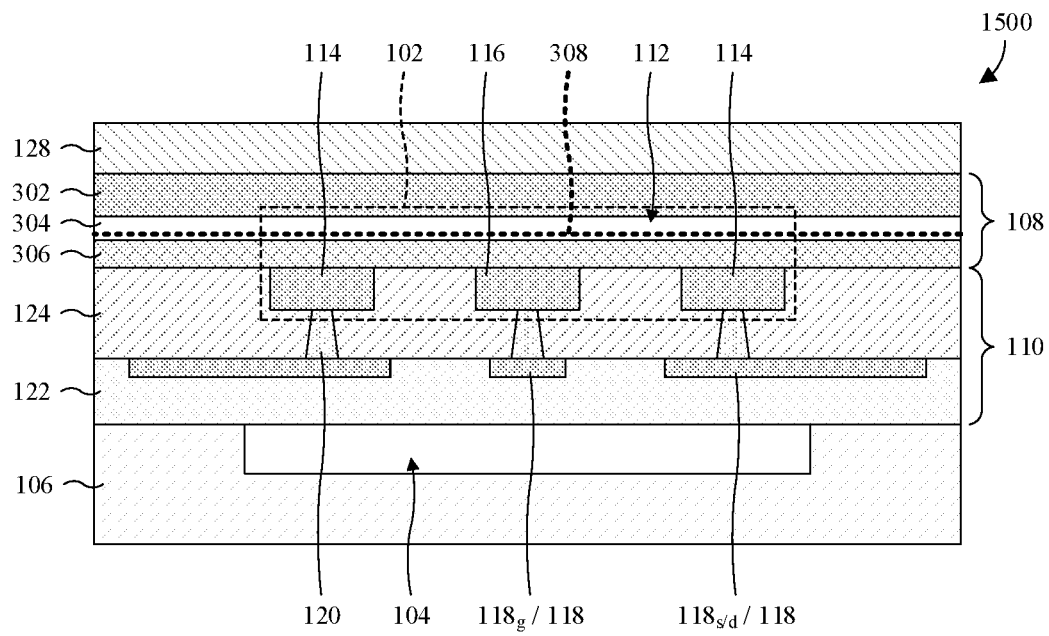

As illustrated by the cross-sectional view 1500 of FIG. 15, a passivation layer 128 is deposited over the semiconductor layer 108. The passivation layer 128 may, for example, be or comprise silicon nitride, aluminum oxide, some other suitable dielectric(s), or any combination of the foregoing.

Figure 16:
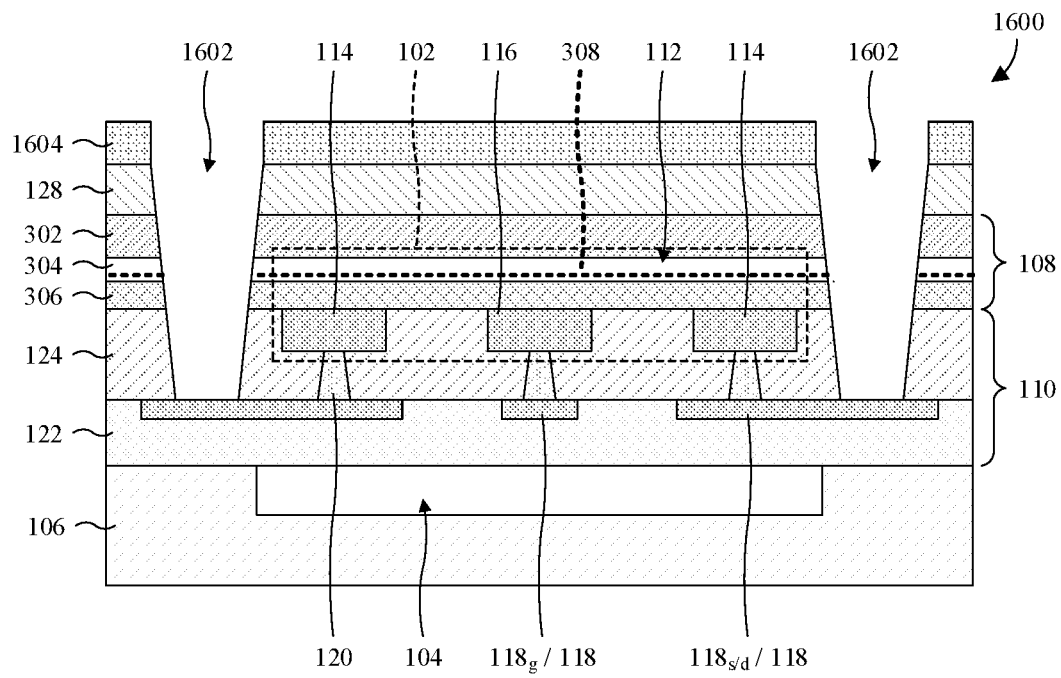

As illustrated by the cross-sectional view 1600 of FIG. 16, the passivation layer 128, the semiconductor layer 108, and the ILD layer 124 are patterned to form contact openings 1602. The contact openings 1602 are individual to the pads 118 and respectively expose the pads 118. In some embodiments, the contact openings 1602 have the same top layout as the contacts 130 in FIG. 2 and/or FIG. 6. The patterning may, for example, comprise: 1) forming a mask 1604 over the passivation layer 128; 2) etching the passivation layer 128, the semiconductor layer 108, and the ILD layer 124 with the mask 1604 in place to form the contact openings 1602; 3) and removing the mask 1604. Other suitable processes for the patterning are, however, amenable. The mask 1604 may, for example, be a photoresist mask formed by photolithography or some other suitable type of mask. The etching may, for example, be performed by dry etching, but other suitable types of etching are amenable.

Figure 17:
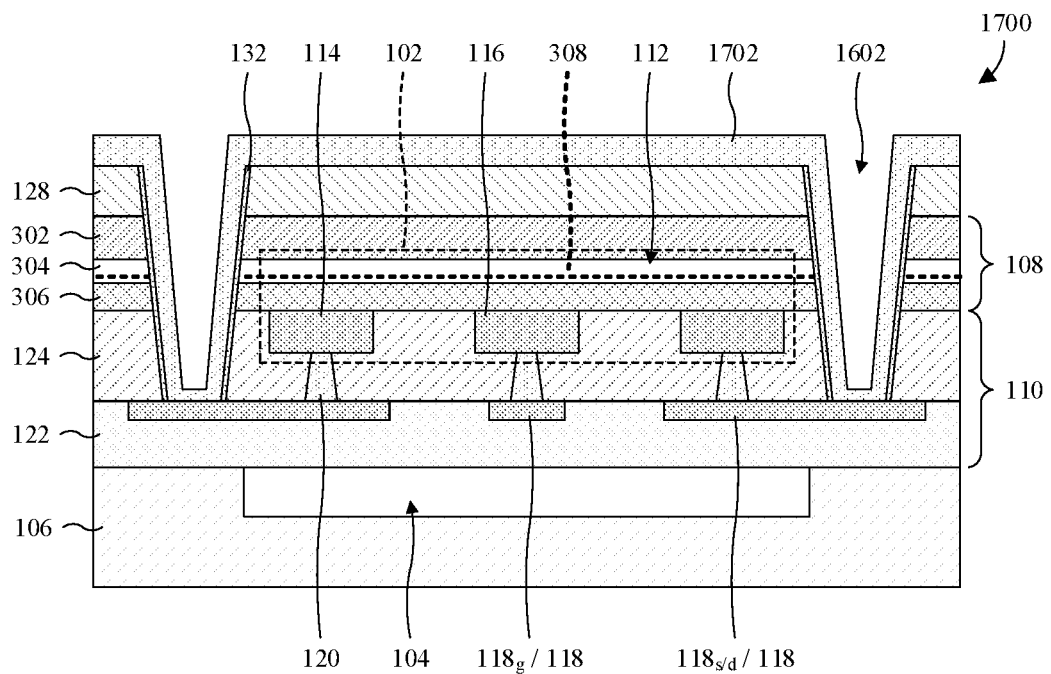

As illustrated by the cross-sectional view 1700 of FIG. 17, contact liner layers 132 are formed lining sidewalls of the contact openings 1602. The contact liner layers 132 are individual to the contact openings 1602 and are localized to sidewalls respectively of the contact openings 1602. The contact liner layers 132 are dielectric and may be or comprise, for example, silicon oxide and/or some other suitable dielectric(s). A process for forming the contact liner layers 132 may, for example, comprise: 1) depositing a dielectric layer covering the passivation layer 128 and lining the contact openings 1602; and 2) etching back the dielectric layer to remove the dielectric layer from atop the passivation layer 128 and to divide the dielectric layer into the contact liner layers 132. Other suitable processes are, however, amenable.

Also illustrated by the cross-sectional view 1700 of FIG. 17, a conductive layer 1702 is deposited over the passivation layer 128 and the contact liner layers 132 and further lining the contact openings 1602. The conductive layer 1702 directly contacts and electrically couples to the pads 118 and may, for example, be or comprise copper, aluminum copper, aluminum, some other suitable conductive material(s), or any combination of the foregoing.

Figure 18:
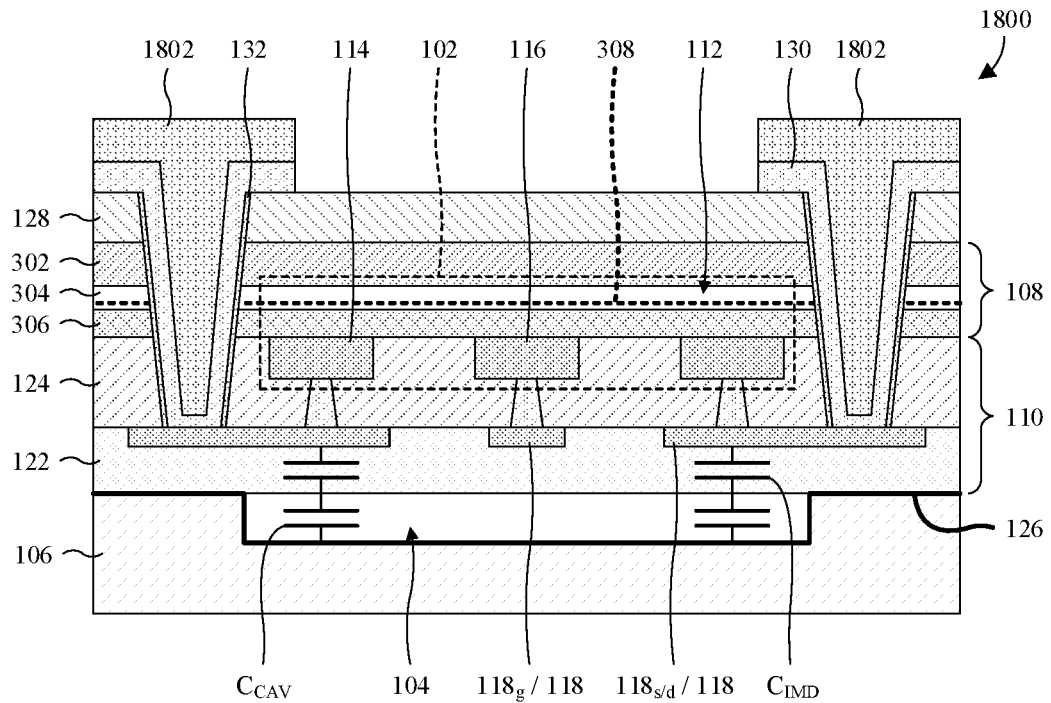

As illustrated by the cross-sectional view 1800 of FIG. 18, the conductive layer 1702 is patterned to form contacts 130 individual to and electrically coupled respectively to the pads 118. The patterning may, for example, comprise: 1) forming a mask 1802 over the conductive layer 1702; 2) etching the conductive layer 1702 with the mask 1802 in place to form the contacts 130; 3) and removing the mask 1802. Other suitable processes for the patterning are, however, amenable. The mask 1802 may, for example, be a photoresist mask formed by photolithography or some other suitable type of mask. The etching may, for example, be performed by dry etching, but other suitable types of etching are amenable.

During operation of the semiconductor device 102, capacitive coupling between the source/drain pads 118$_{s/d}$ and the second semiconductor substrate 106 may decrease substrate resistance, increase substrate power loss, and decrease PAE. However, because of the cavity 104, the negative effects of this capacitive coupling may be mitigated.

The cavity 104 is electrically insulating and hence serves as a dielectric region separating the second semiconductor substrate 106 from the IMD layer 122 and the source/drain pads $118_{s/d}$. As a result, source/drain capacitance at each of the source/drain pads $118_{s/d}$ may be modeled as two capacitors that are electrically coupled in series and that are respectively in the IMD layer 122 and the cavity 104. For clarity, the capacitors respectively at the IMD layer 122 and the cavity 104 are respectively labeled $C_{IMD}$ and $C_{CAV}$. Multiple capacitors in series yield a smaller capacitance than the capacitances of the individual capacitors, such that the cavity 104 may decrease the source/drain capacitances compared to what the source/drain capacitances would be without the cavity 104. For example, a source/drain capacitance may be equal to $$\frac{C_{IMD}C_{CAV}}{C_{IMD}+C_{CAV}}.$$

Therefore, supposing the IMD capacitors $C_{IMD}$ and the cavity capacitors $C_{CAV}$ are respectively 1 microfarad and 0.25 microfarad, a source/drain capacitance may achieve an 80% reduction $$\left(\text{e.g.,}\ \frac{1*0.25}{1+0.25}=0.2\right).$$

Note that these capacitances are non-limiting examples and other capacitances are amenable. Because the source/drain capacitances may be decreased by the cavity 104, substrate capacitance may be decreased and hence substrate resistance may be increased. Because substrate resistance may be increased, substrate power loss may be reduced. This may, in turn, increase the PAE of the semiconductor device 102. The PAE is an important parameter for, among other things, 5G mobile communications and other suitable RF applications.

As described above, the cavity 104 may be regarded as a dielectric region. In some embodiments, a dielectric constant of the cavity 104 is less than that of the IMD layer 122. The lower the dielectric constant, the lower the capacitances of the cavity capacitors $C_{CAV}$ and the more significant the decrease in the source/drain capacitances.

To further improve the PAE of the semiconductor device 102, the cavity 104 is inset into the second semiconductor substrate 106 and, in some embodiments, the second semiconductor substrate 106 has a high resistance. The high resistance of the second semiconductor substrate 106 increases substrate resistance and hence decreases substrate power loss. This, in turn, increases PAE. Insetting the cavity 104 into the second semiconductor substrate 106 increases a length of an interface 126 between the semiconductor substrate 106 and the IMD layer 122 and between the semiconductor substrate 106 and the cavity 104. This increases interface resistance from a drain side of the semiconductor device 102 to a source side of the semiconductor device 102, which increases substrate resistance and hence decreases substrate power loss. This, in turn, increases PAE.

While FIGS. 9, 10, 11A, 11B, and 12-18 are described with reference to a method, it will be appreciated that the structures shown in FIGS. 9, 10, 11A, 11B, and 12-18 are not limited to the method but rather may stand alone separate of the method. While FIGS. 9, 10, 11A, 11B, and 12-18 are described as a series of acts, it will be appreciated that the order of the acts may be altered in other embodiments. While FIGS. 9, 10, 11A, 11B, and 12-18 illustrate and describe as a specific set of acts, some acts that are illustrated and/or described may be omitted in other embodiments. Further, acts that are not illustrated and/or described may be included in other embodiments.

Figure 19:
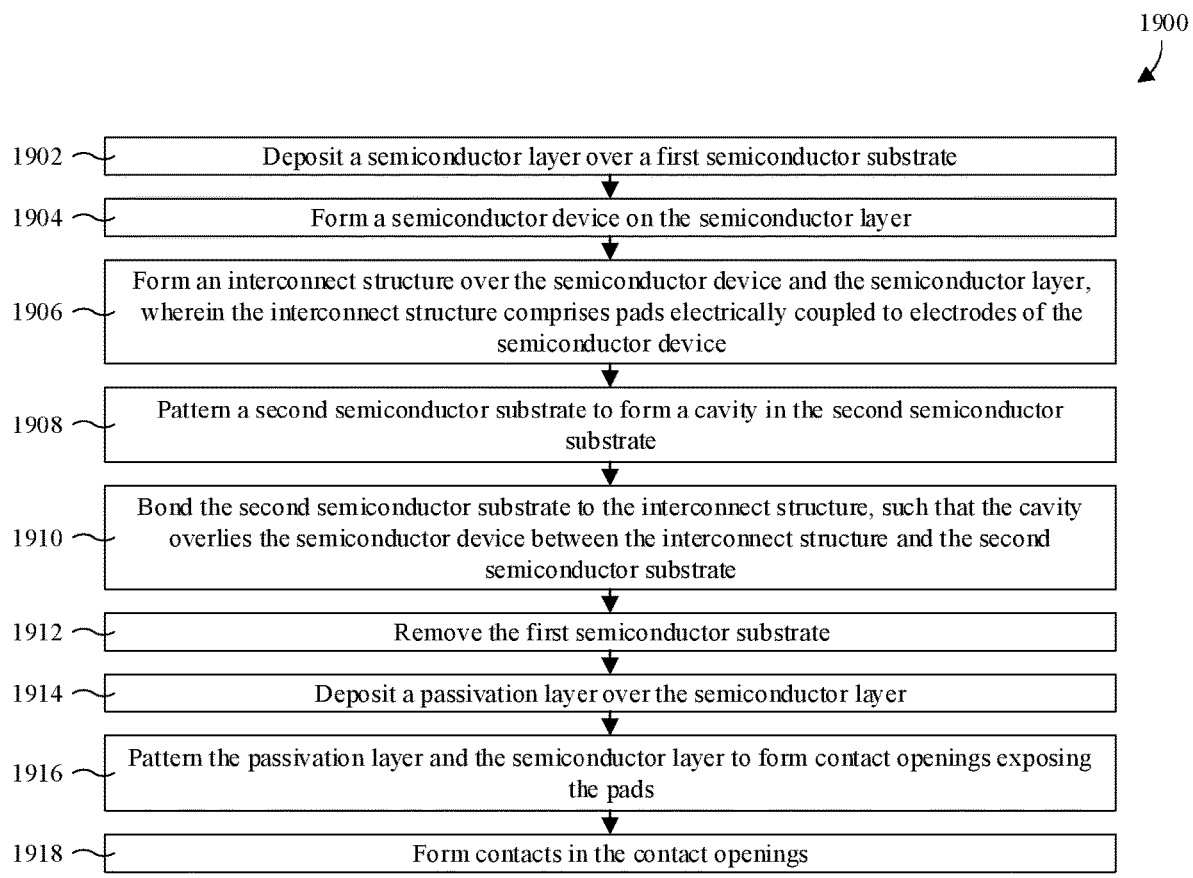
FIG. 19 illustrates a block diagram of some embodiments of the method of FIGS. 9, 10, 11A, 11B, and 12-18.

With reference to FIG. 19, a block diagram 1900 of some embodiments of the method of FIGS. 9, 10, 11A, 11B, and 12-18 is provided.

At 1902, a semiconductor layer is deposited over a first semiconductor substrate. See, for example, FIG. 9. In some embodiments, the semiconductor layer is a group III-V semiconductor layer, a group II-VI semiconductor layer, a group IV-IV semiconductor layer, or some other suitable type of semiconductor layer. In some embodiments, the semiconductor layer is made up of multiple different layers.

At 1904, a semiconductor device is formed on the semiconductor layer. See, for example, FIG. 9. The semiconductor device may, for example, be a HEMT, a MOSFET, or some other suitable type of semiconductor device.

At 1906, an interconnect structure is formed over the semiconductor device and the semiconductor layer, wherein the interconnect structure comprises pads electrically coupled to electrodes of the semiconductor device. See, for example, FIG. 10.

At 1908, a second semiconductor substrate is patterned to form a cavity in the second semiconductor substrate. See, for example, FIGS. 11A and 11B. In some embodiments, the second semiconductor substrate has a higher resistance than the first semiconductor substrate.

At 1910, the second semiconductor substrate is bonded to the interconnect structure, such that the cavity overlies the semiconductor device between the interconnect structure and the second semiconductor substrate. See, for example, FIG. 12.

At 1912, the first semiconductor substrate is removed. See, for example, FIGS. 13 and 14.

At 1914, a passivation layer is deposited over the semiconductor layer. See, for example, FIG. 15.

At 1916, the passivation layer and the semiconductor layer are patterned to form contact openings exposing the pads. See, for example, FIG. 16.

At 1918, contacts are formed in the contact openings. See, for example, FIGS. 17 and 18.

While the block diagram 1900 of FIG. 19 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

With reference to FIGS. 20A, 20B, and 21-28, a series of cross-sectional views 2000A, 2000B, 2100-2800 of some alternative embodiments of the method of FIGS. 9, 10, 11A, 11B, and 12-18 is provided in which the at least one cavity is filled with a cavity-fill dielectric layer. The method may, for example, be employed to form the IC chip of FIG. 4A, the IC chip of FIG. 7A, or some other suitable IC chip.

Figure 20A:
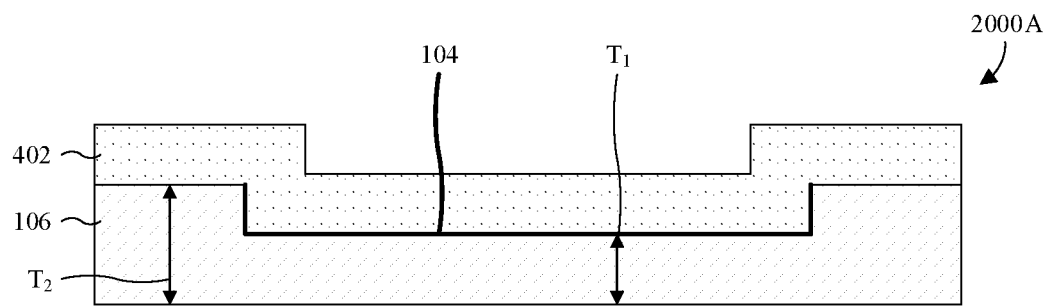
FIGS. 20A, 20B, and 21-28 illustrate a series of cross-sectional views of some alternative embodiments of the method of FIGS. 9, 10, 11A, 11B, and 12-18 in which the at least one cavity is filled with a cavity-fill dielectric layer.

As illustrated by the cross-sectional view 2000A of FIG. 20A, a second semiconductor substrate 106 is patterned to form a cavity 104 as described with regard to FIG. 11A.

Further, a cavity-fill dielectric layer 402 is deposited covering the second semiconductor substrate 106 and filling the cavity 104.

In some embodiments, the cavity-fill dielectric layer 402 is or comprise a dielectric oxide and/or some other suitable dielectric(s). In some embodiments, the cavity-fill dielectric layer 402 is a low k dielectric material or an extreme low k dielectric material. A low k dielectric material may, for example, be a dielectric material with a dielectric constant of about 2-3.9 or some other suitable value. An extreme low k dielectric material may, for example, be a dielectric material with a dielectric constant less than about 2 or some other suitable value. In some embodiments, the cavity-fill dielectric layer 402 has a lower dielectric constant than an IMD layer to which the second semiconductor substrate 106 is hereafter bonded.

Figure 20B:
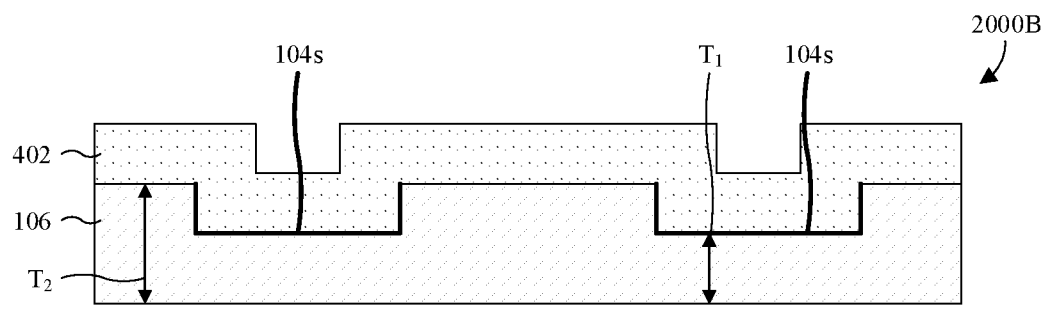

As illustrated by the cross-sectional view 2000B of FIG. 20B, the second semiconductor substrate 106 is alternatively patterned to form multiple small cavities 104s as described with regard to FIG. 11B. Further, the cavity-fill dielectric layer 402 is deposited covering the second semiconductor substrate 106 and filling the small cavities 104s.

Figure 21:
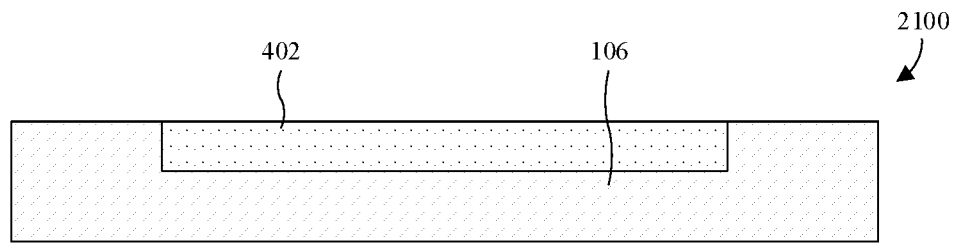

As illustrated by the cross-sectional view 2100 of FIG. 21, a planarization is performed into the cavity-fill dielectric layer 402 to remove the cavity-fill dielectric layer 402 from atop a top surface of the second semiconductor substrate 106. As noted above, FIGS. 20A and 20B are alternatives of each other. FIG. 21 illustrates the method proceeding from FIG. 20A, while skipping FIG. 20B, and hence FIGS. 21-28 use embodiments of the second semiconductor substrate 106 in FIG. 20A. In alternative embodiments, the method proceeds from FIG. 20B, while skipping FIG. 20A, and hence FIGS. 21-28 use embodiments of the second semiconductor substrate 106 in FIG. 20B. The planarization may, for example, be performed by a CMP or some other suitable planarization process.

Figure 22:
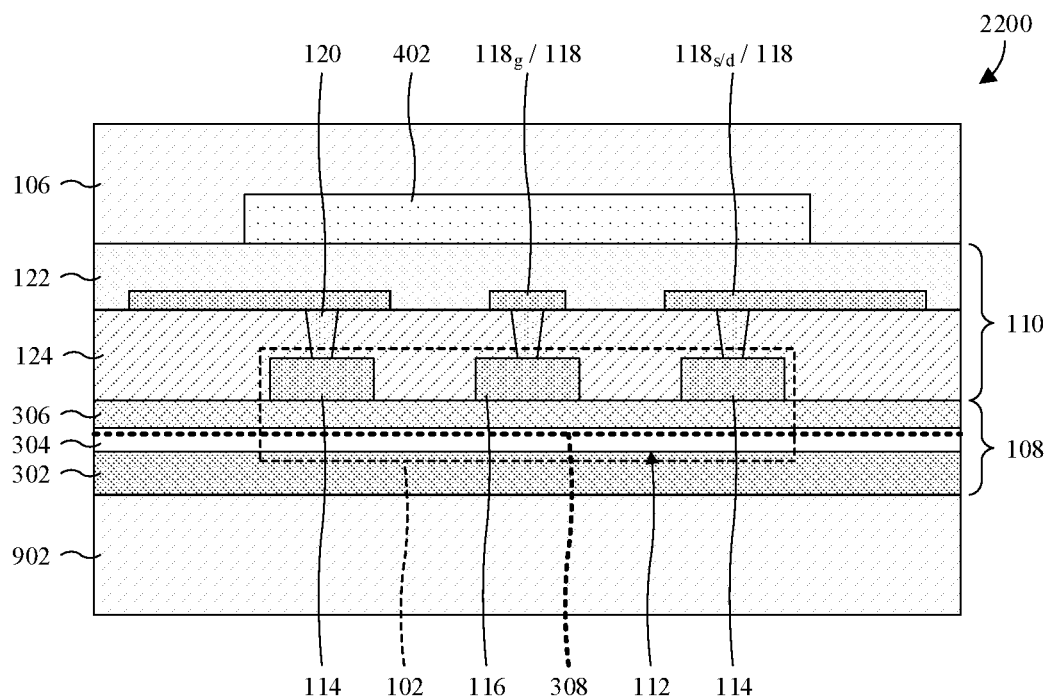
Figure 23:
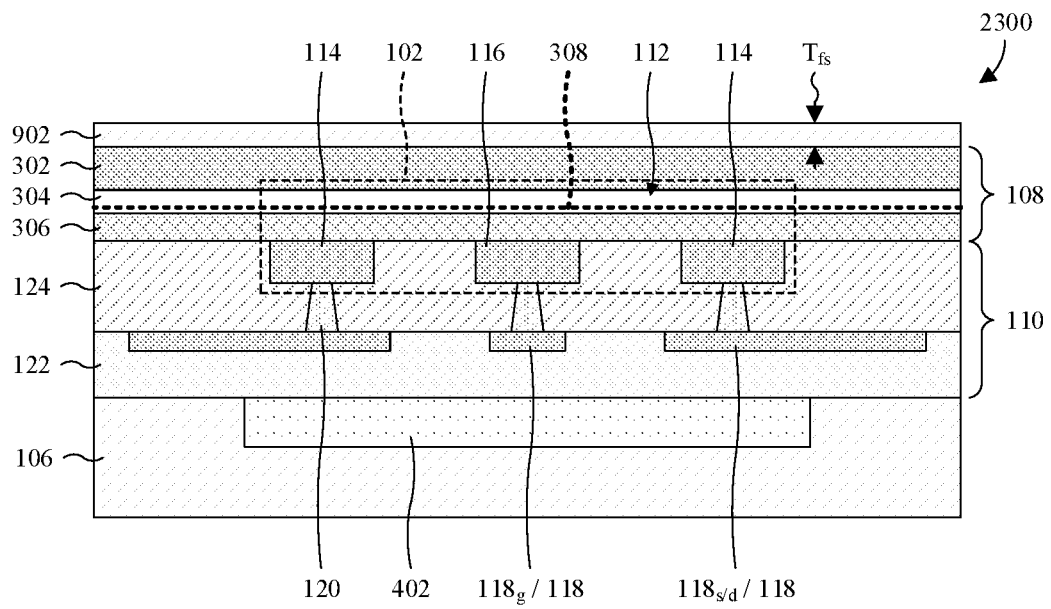
Figure 24:
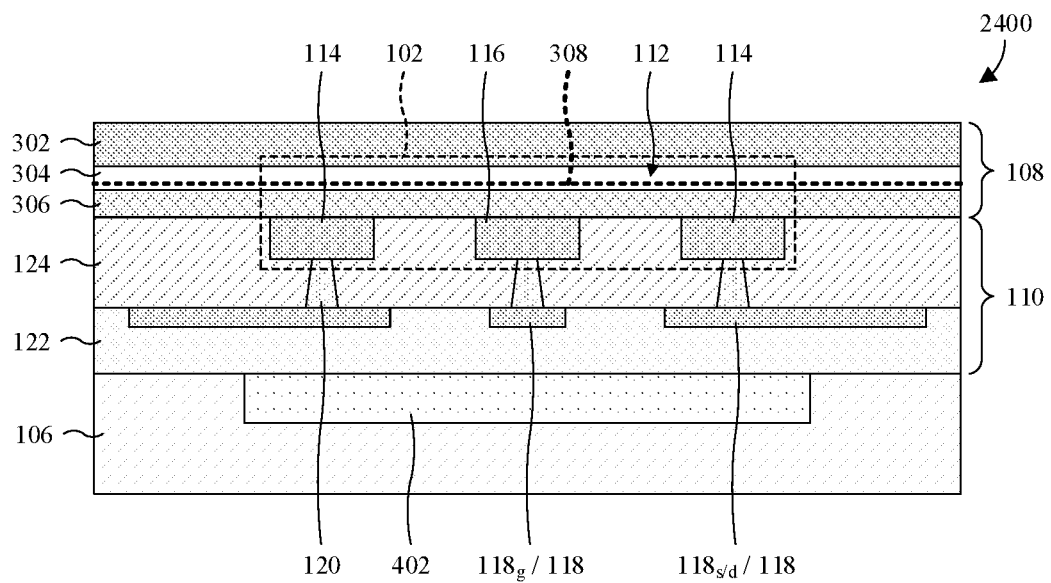
Figure 25:
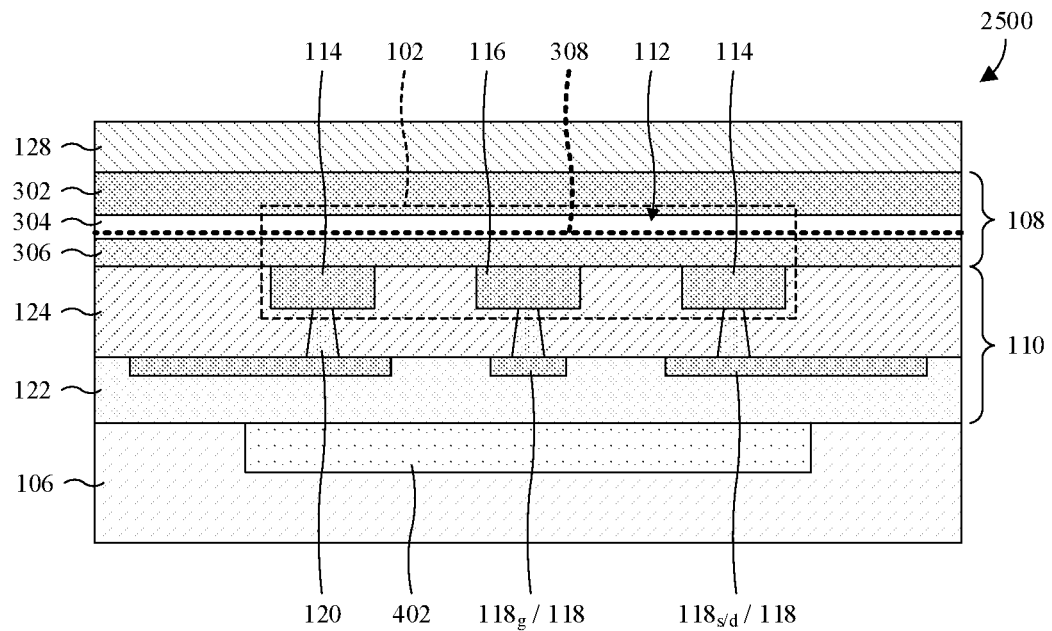
Figure 26:
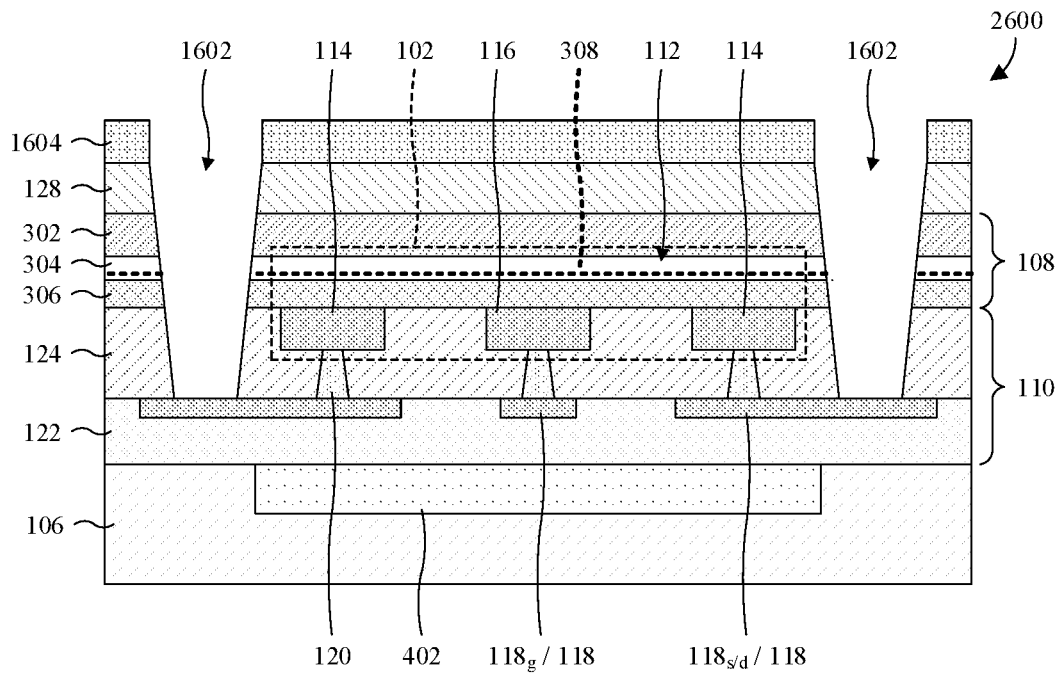
Figure 27:
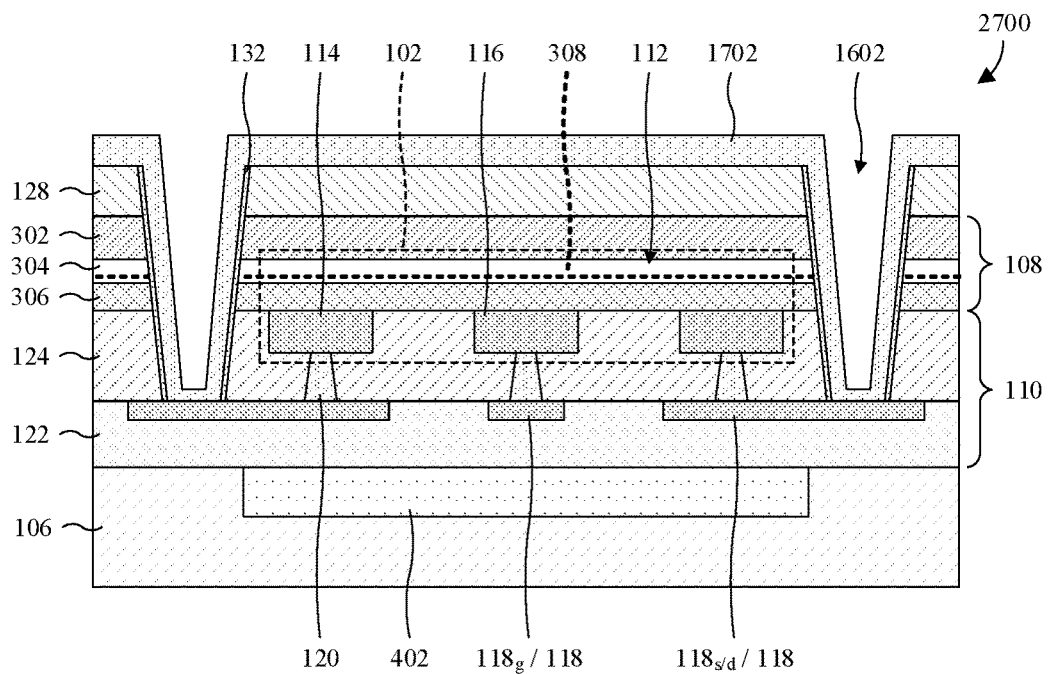
Figure 28:
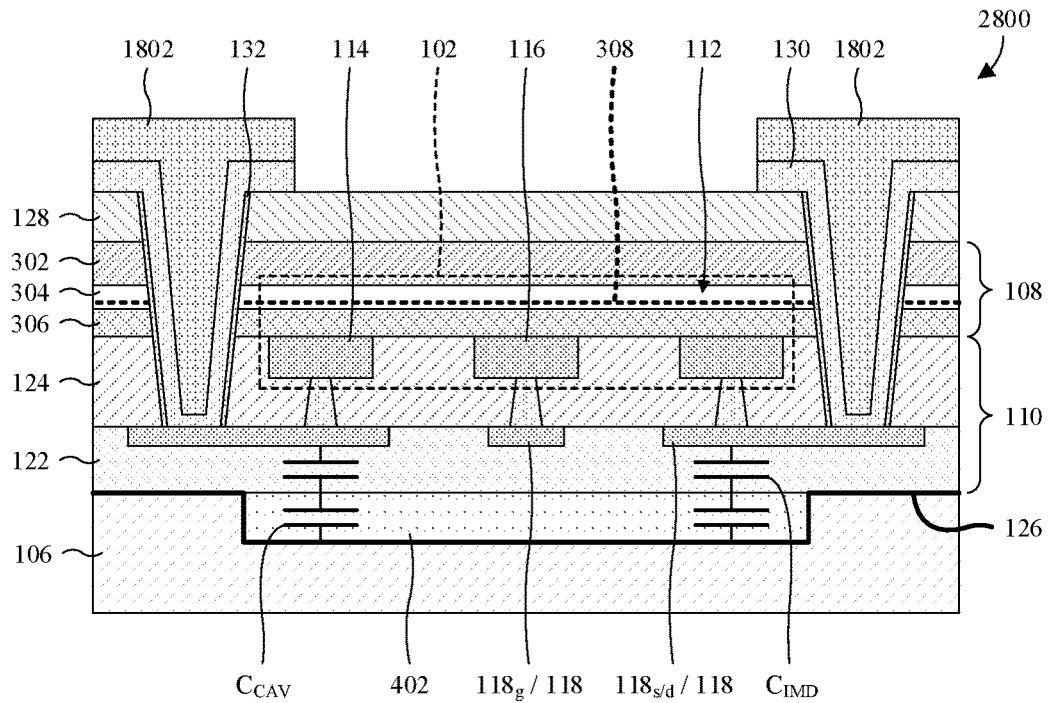

As illustrated by the cross-sectional view 2200 of FIG. 22, the acts at FIGS. 9 and 10 are performed. A semiconductor layer 108 is epitaxially deposited over a first semiconductor substrate 902, and a semiconductor device 102 is formed on the semiconductor layer 108, as described with regard to FIG. 9. An interconnect structure 110 is formed over and electrically coupled to the semiconductor device 102 as described with regard to FIG. 10.

Also illustrated by the cross-sectional view 2200 of FIG. 22, the structure of FIG. 21 is flipped vertically and is arranged over and bonded to the interconnect structure 110. Because of the presence of the cavity-fill dielectric layer 402, bond area between the structure of FIG. 21 and the interconnect structure 110 is large. If the cavity-fill dielectric layer 402 was omitted, the bond area would be small. Because of the large bond area, bond strength is strong and the likelihood of mechanical failure along the bond interface is low. The bonding may, for example, be performed by fusion bonding or by some other suitable type of bonding.

As illustrated by the cross-sectional views 2300-2800 of FIGS. 23-28, the acts at FIGS. 13-18 are performed. At FIG. 23, the structure of FIG. 22 is flipped vertically and the first semiconductor substrate 902 is thinned as described with regard to FIG. 13. At FIG. 24, a remainder of the first semiconductor substrate 902 is removed as described with regard to FIG. 14. At FIG. 25, a passivation layer 128 is deposited over the semiconductor layer 108 as described with regard to FIG. 15. At FIG. 26, the passivation layer 128, the semiconductor layer 108, and the ILD layer 124 are patterned to form contact openings 1602 as described with regard to FIG. 16. At FIG. 27, contact liner layers 132 are formed lining sidewalls of the contact openings 1602, and a conductive layer 1702 is deposited lining the contact openings 1602, as described with regard to FIG. 17. At FIG. 28, the conductive layer 1702 is patterned to form contacts 130 in the contact openings 1602 as described with regard to FIG. 18.

While FIGS. 20A, 20B, and 21-28 are described with reference to a method, it will be appreciated that the structures shown in FIGS. 20A, 20B, and 21-28 are not limited to the method but rather may stand alone separate of the method. While FIGS. 20A, 20B, and 21-28 are described as a series of acts, it will be appreciated that the order of the acts may be altered in other embodiments. While FIGS. 20A, 20B, and 21-28 illustrate and describe as a specific set of acts, some acts that are illustrated and/or described may be omitted in other embodiments. Further, acts that are not illustrated and/or described may be included in other embodiments.

Figure 29:
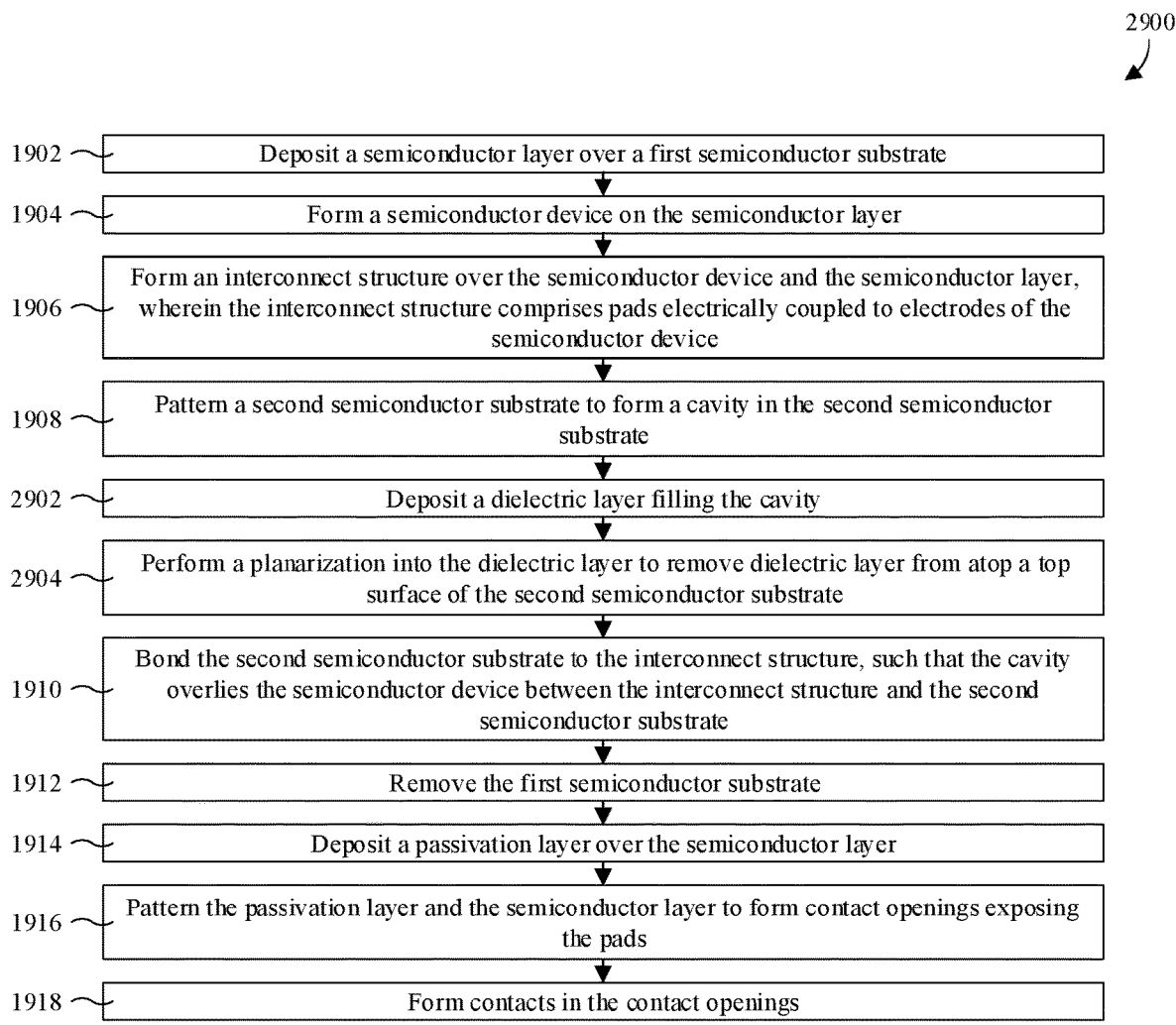
FIG. 29 illustrates a block diagram of some embodiments of the method of FIGS. 20A, 20B, and 21-28.

With reference to FIG. 29, a block diagram 2900 of some embodiments of the method of FIGS. 20A, 20B, and 21-28 is provided.

At 1902, a semiconductor layer is deposited over a first semiconductor substrate. See, for example, FIG. 22.

At 1904, a semiconductor device is formed on the semiconductor layer. See, for example, FIG. 22.

At 1906, an interconnect structure is formed over the semiconductor device and the semiconductor layer, wherein the interconnect structure comprises pads electrically coupled to electrodes of the semiconductor device. See, for example, FIG. 22.

At 1908, a second semiconductor substrate is patterned to form a cavity in the second semiconductor substrate. See, for example, FIGS. 20A and 20B.

At 2902, a dielectric layer is deposited filling the cavity. See, for example, FIGS. 20A and 20B.

At 2904, a planarization is performed into the dielectric layer to remove dielectric layer from atop a top surface of the second semiconductor substrate. See, for example, FIG. 21.

At 1910, the second semiconductor substrate is bonded to the interconnect structure, such that the cavity overlies the semiconductor device between the interconnect structure and the second semiconductor substrate. See, for example, FIG. 22.

At 1912, the first semiconductor substrate is removed. See, for example, FIGS. 23 and 24.

At 1914, a passivation layer is deposited over the semiconductor layer. See, for example, FIG. 25.

At 1916, the passivation layer and the semiconductor layer are patterned to form contact openings exposing the pads. See, for example, FIG. 26.

At 1918, contacts are formed in the contact openings. See, for example, FIGS. 27 and 28.

While the block diagram 2900 of FIG. 29 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

With reference to FIGS. 30, 31A, 31B, and 32-38, a series of cross-sectional views 3000, 3100A, 3100B, 3200-3800 of some alternative embodiments of the method of FIGS. 9, 10, 11A, 11B, and 12-18 in which the at least one cavity is filled with a cavity-fill dielectric layer. The method may, for example, be employed to form the IC chip of FIG. 4B, the IC chip of FIG. 7B, or some other suitable IC chip.

Figure 30:
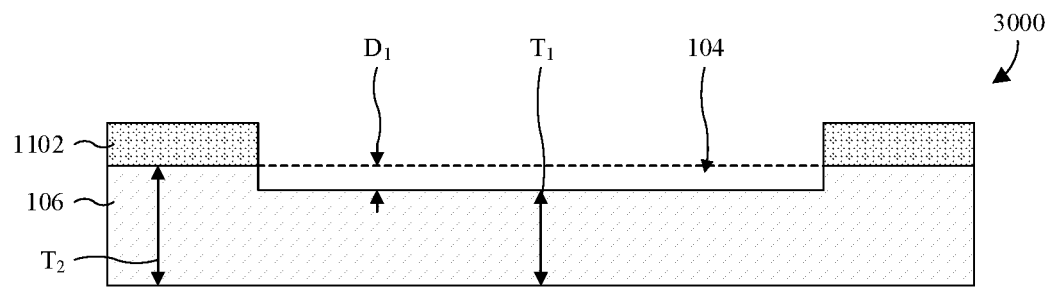
FIGS. 30, 31A, 31B, and 32-38 illustrate a series of cross-sectional views of some alternative embodiments of the method of FIGS. 9, 10, 11A, 11B, and 12-18 in which recesses are at a bottom of the at least one cavity.

As illustrated by the cross-sectional view 3000 of FIG. 30, a second semiconductor substrate 106 is patterned to form a cavity 104 extending into a second semiconductor substrate 106 to a first depth $D_1$. Due to the patterning, the second semiconductor substrate 106 has a first thickness $T_1$ at a portion underlying the cavity 104 and further has a second thickness $T_2$ greater than the first thickness $T_1$ at portions laterally offset from the cavity 104. The second semiconductor substrate 106, the cavity 104, and the patterning may, for example, be as described with regard to FIG. 11A.

Figure 31A:
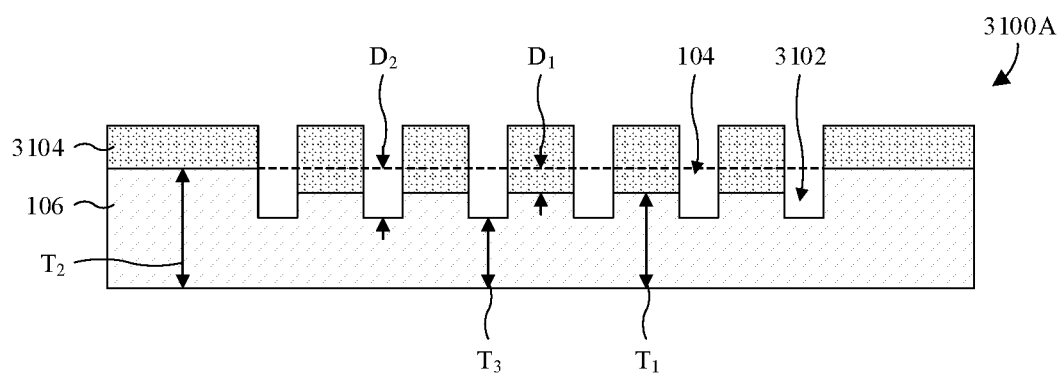

As illustrated by the cross-sectional view 3100A of FIG. 31A, the second semiconductor substrate 106 is further patterned to form recesses 3102 at a bottom of the cavity 104 and to hence extend the cavity 104 to a second depth $D_2$ greater than the first depth $D_1$ at the recesses 3102. In some embodiments, the recesses 3102 are evenly spaced from a first side of the cavity 104 to a second side of the cavity 104 opposite the first side.

By forming the recesses 3102, the second semiconductor substrate 106 alternates between the first thickness $T_1$ and a third thickness $T_3$ less than the first thickness $T_1$ from the first side to the second side. Further, the cavity 104 alternates between the first depth $D_1$ and the second depth $D_2$ from the first side to the second side and hence has an uneven bottom profile. This increases the length of a substrate interface (e.g., 126 in FIG. 38), which increases interface resistance and substrate resistance. This reduces substrate power loss and increases PAE.

The patterning may, for example, comprise: 1) forming a mask 3104 over the second semiconductor substrate 106; 2) etching the second semiconductor substrate 106 with the mask 3104 in place to form the recesses 3102; 3) and removing the mask 3104. Other suitable processes for the patterning are, however, amenable. The mask 3104 may, for example, be a photoresist mask formed by photolithography or some other suitable type of mask. The etching may, for example, be performed by dry etching, but other suitable types of etching are amenable.

Figure 31B:
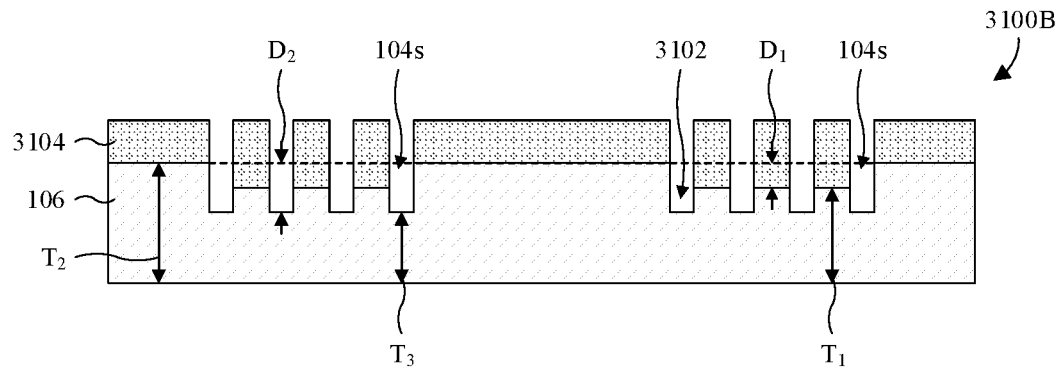

As illustrated by the cross-sectional view 3100B of FIG. 31B, the second semiconductor substrate 106 alternatively has multiple small cavities 104s extending into a second semiconductor substrate 106 to the first depth $D_1$. The small cavities 104s may, for example, be as described with regard to FIG. 11B. Further, the second semiconductor substrate 106 is patterned to form recesses 3102 at a bottom of each small cavity 104s and to hence extend each small cavity 104s to the second depth $D_2$ greater than the first depth $D_1$.

Figure 32:
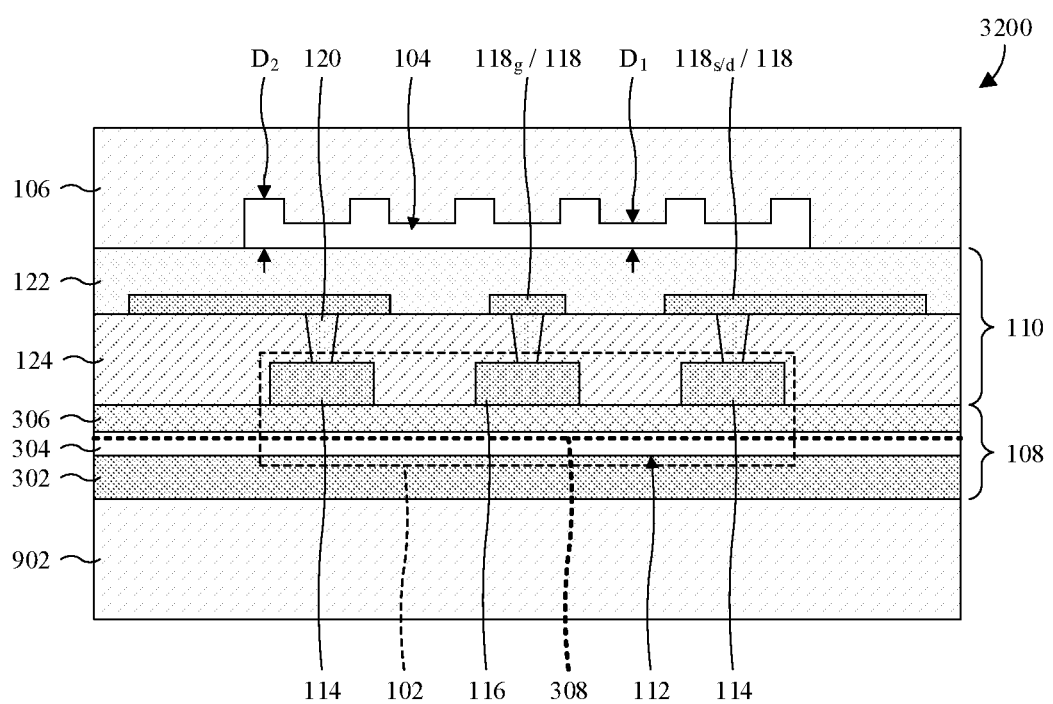
Figure 33:
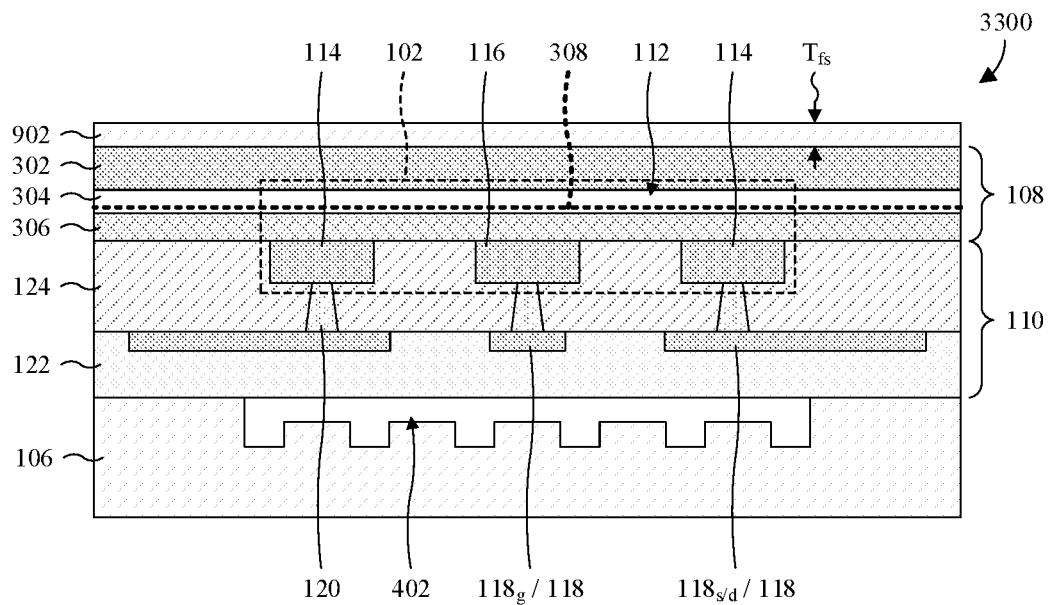
Figure 34:
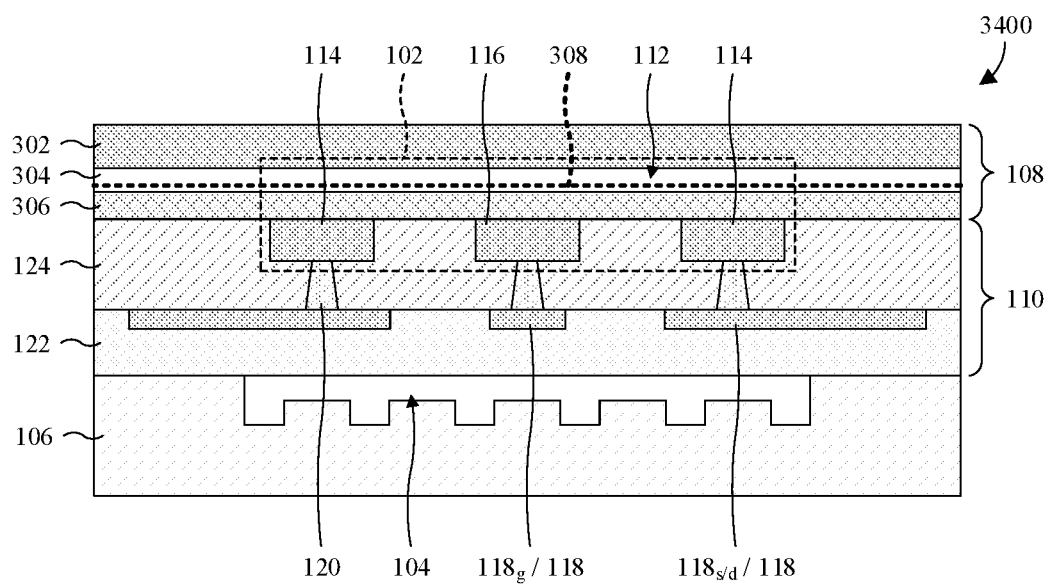
Figure 35:
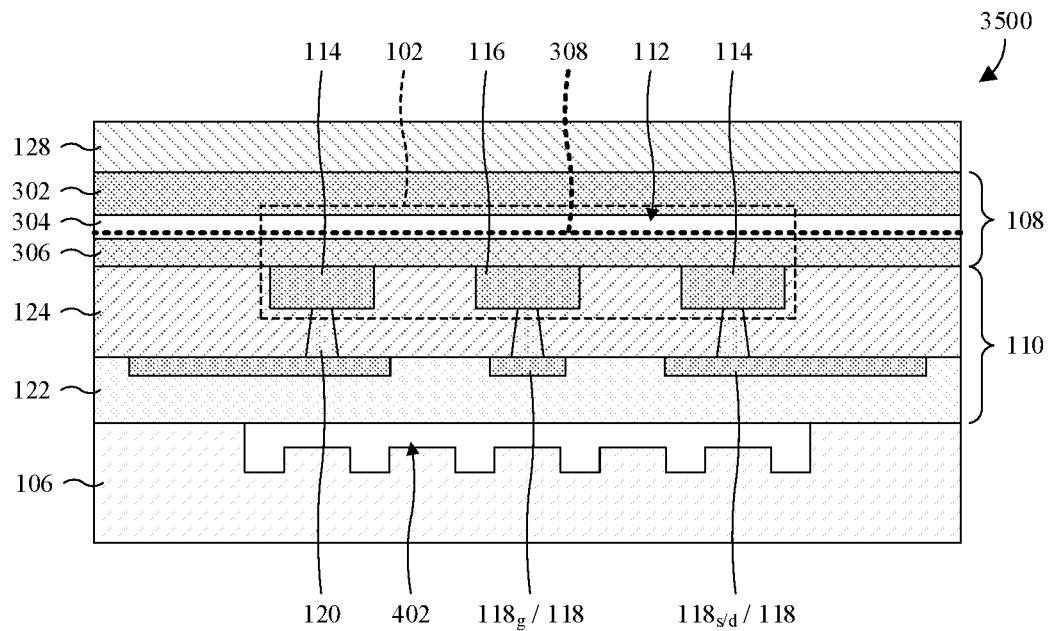
Figure 36:
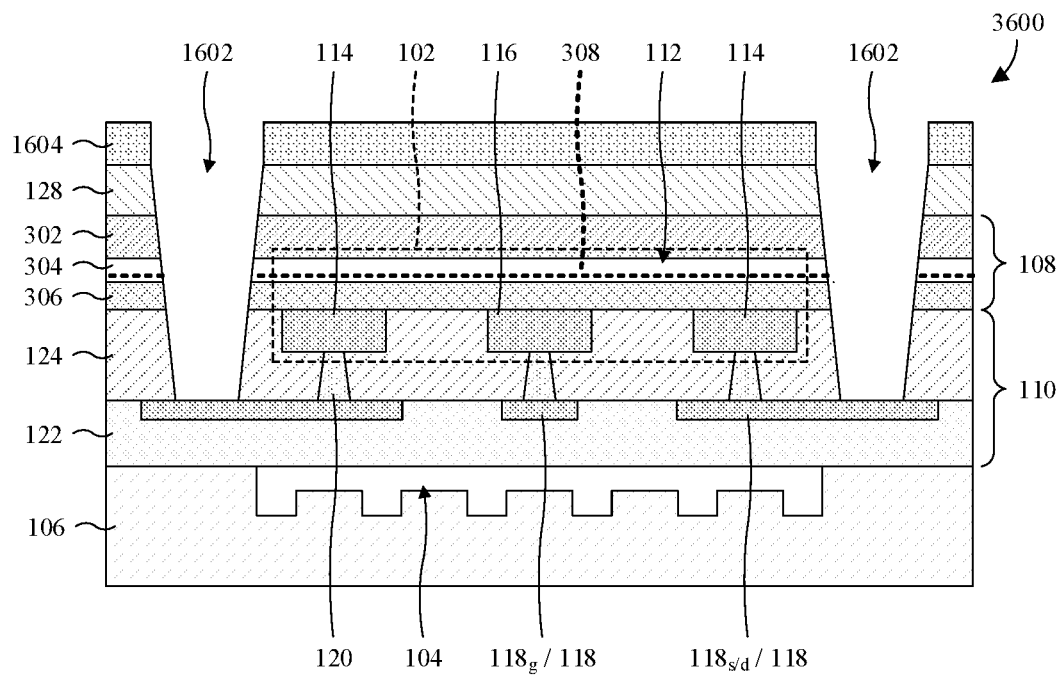
Figure 37:
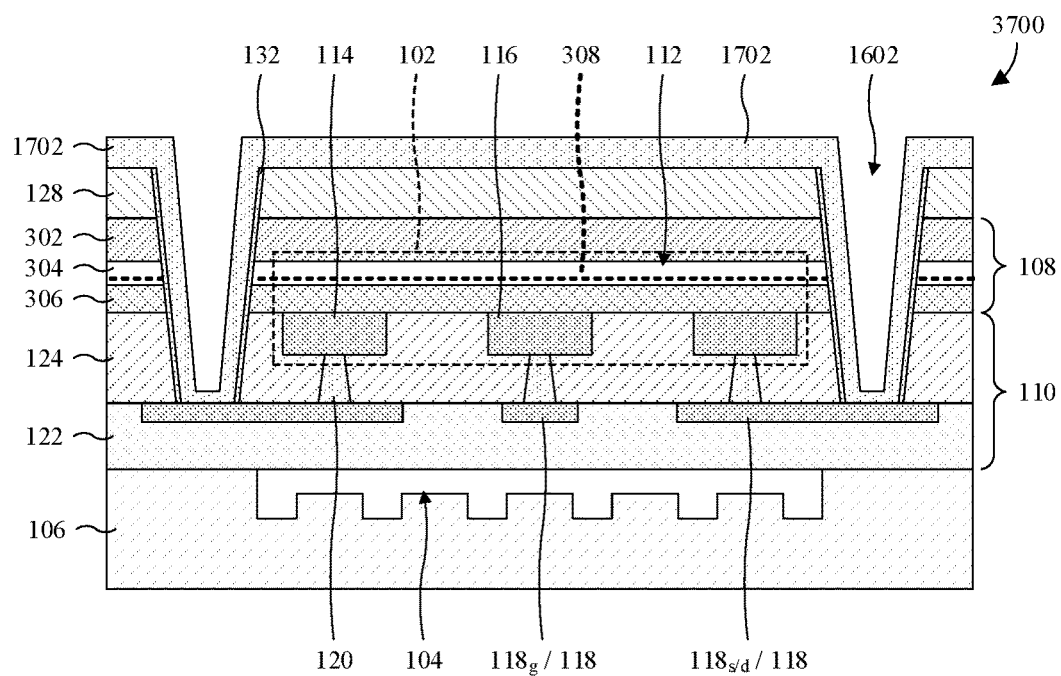
Figure 38:
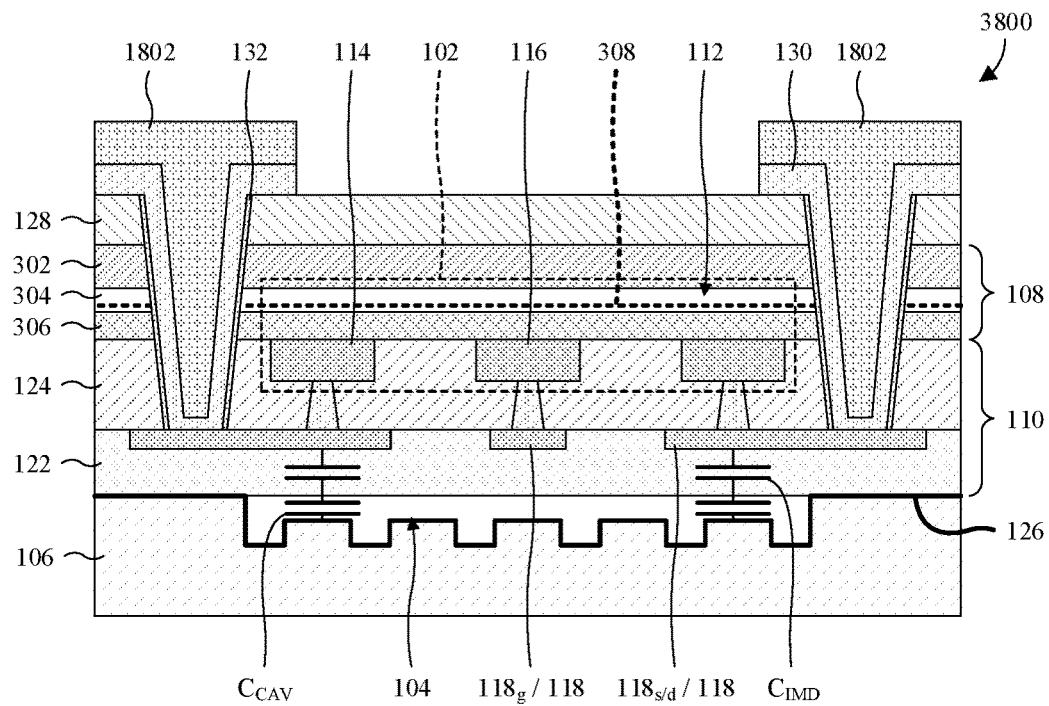

As illustrated by the cross-sectional view 3200 of FIG. 32, the acts at FIGS. 9 and 10 are performed. A semiconductor layer 108 is epitaxially deposited over a first semiconductor substrate 902, and a semiconductor device 102 is formed on the semiconductor layer 108, as described with regard to FIG. 9. An interconnect structure 110 is formed over and electrically coupled to the semiconductor device 102 as described with regard to FIG. 10.

Also illustrated by the cross-sectional view 3200 of FIG. 32, the structure of FIG. 31A is flipped vertically and is arranged over and bonded to the interconnect structure 110. As noted above, FIGS. 31A and 31B are alternatives of each other. FIG. 32 illustrates the method proceeding from FIG. 31A, while skipping FIG. 31B, and hence FIGS. 32-38 use embodiments of the second semiconductor substrate 106 in FIG. 31A. In alternative embodiments, the method proceeds from FIG. 31B, while skipping FIG. 31A, and hence FIGS. 32-38 use embodiments of the second semiconductor substrate 106 in FIG. 31B.

As illustrated by the cross-sectional views 3300-3800 of FIGS. 33-38, the acts at FIGS. 13-18 are performed. At FIG. 33, the structure of FIG. 32 is flipped vertically and the first semiconductor substrate 902 is thinned as described with regard to FIG. 13. At FIG. 34, a remainder of the first semiconductor substrate 902 is removed as described with regard to FIG. 14. At FIG. 35, a passivation layer 128 is deposited over the semiconductor layer 108 as described with regard to FIG. 15. At FIG. 36, the passivation layer 128, the semiconductor layer 108, and the ILD layer 124 are patterned to form contact openings 1602 as described with regard to FIG. 16. At FIG. 37, contact liner layers 132 are formed lining sidewalls of the contact openings 1602, and a conductive layer 1702 is deposited lining the contact openings 1602, as described with regard to FIG. 17. At FIG. 39, the conductive layer 1702 is patterned to form contacts 130 in the contact openings 1602 as described with regard to FIG. 18.

While FIGS. 30, 31A, 31B, and 32-38 are described with reference to a method, it will be appreciated that the structures shown in FIGS. 30, 31A, 31B, and 32-38 are not limited to the method but rather may stand alone separate of the method. While FIGS. 30, 31A, 31B, and 32-38 are described as a series of acts, it will be appreciated that the order of the acts may be altered in other embodiments. While FIGS. 30, 31A, 31B, and 32-38 illustrate and describe as a specific set of acts, some acts that are illustrated and/or described may be omitted in other embodiments. Further, acts that are not illustrated and/or described may be included in other embodiments.

Figure 39:
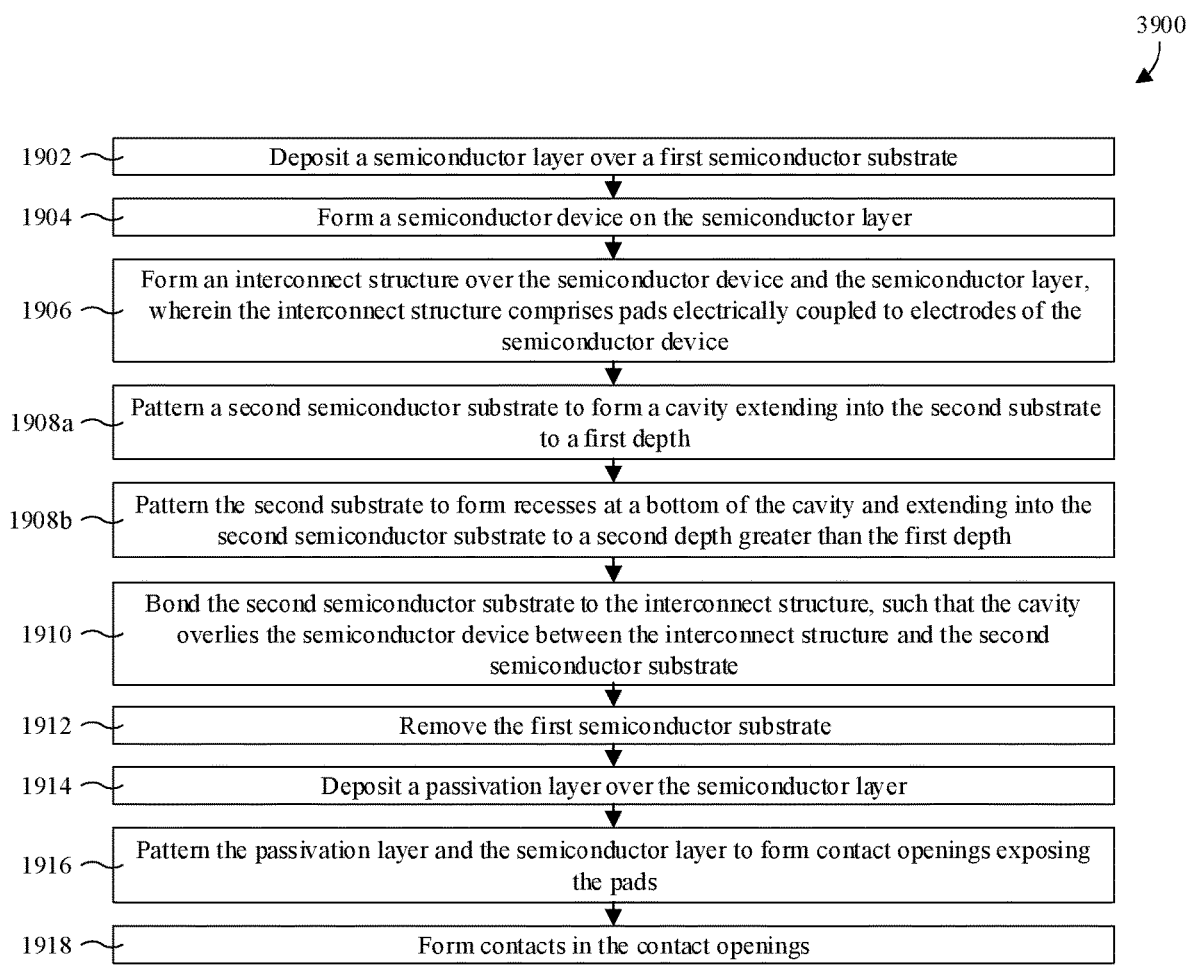
FIG. 39 illustrates a block diagram of some embodiments of the method of FIGS. 30, 31A, 31B, and 32-38.

With reference to FIG. 39, a block diagram 3900 of some embodiments of the method of FIGS. 30, 31A, 31B, and 32-38 is provided.

At 1902, a semiconductor layer is deposited over a first semiconductor substrate. See, for example, FIG. 32.

At 1904, a semiconductor device is formed on the semiconductor layer. See, for example, FIG. 32.

At 1906, an interconnect structure is formed over the semiconductor device and the semiconductor layer, wherein the interconnect structure comprises pads electrically coupled to electrodes of the semiconductor device. See, for example, FIG. 32.

At 1908a, a second semiconductor substrate is patterned to form a cavity extending into the second substrate to a first depth. See, for example, FIG. 30.

At 1908b, the second substrate is patterned to form recesses at a bottom of the cavity and extending into the second semiconductor substrate to a second depth greater than the first depth. See, for example, FIGS. 31A and 31B.

At 1910, the second semiconductor substrate is bonded to the interconnect structure, such that the cavity overlies the semiconductor device between the interconnect structure and the second semiconductor substrate. See, for example, FIG. 32.

At 1912, the first semiconductor substrate is removed. See, for example, FIGS. 33 and 34.

At 1914, a passivation layer is deposited over the semiconductor layer. See, for example, FIG. 35.

At 1916, the passivation layer and the semiconductor layer are patterned to form contact openings exposing the pads. See, for example, FIG. 36.

At 1918, contacts are formed in the contact openings. See, for example, FIGS. 37 and 38.

While the block diagram 3900 of FIG. 39 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

With reference to FIGS. 40A, 40B, and 41-48, a series of cross-sectional views 4000A, 4000B, 4100-4800 of some alternative embodiments of the method of FIGS. 30, 31A, 31B, and 32-38 is provided in which the at least one cavity is filled with a cavity-fill dielectric layer. The method may, for example, be employed to form the IC chip of FIG. 4C, the IC chip of FIG. 7C, or some other suitable IC chip.

Figure 40A:
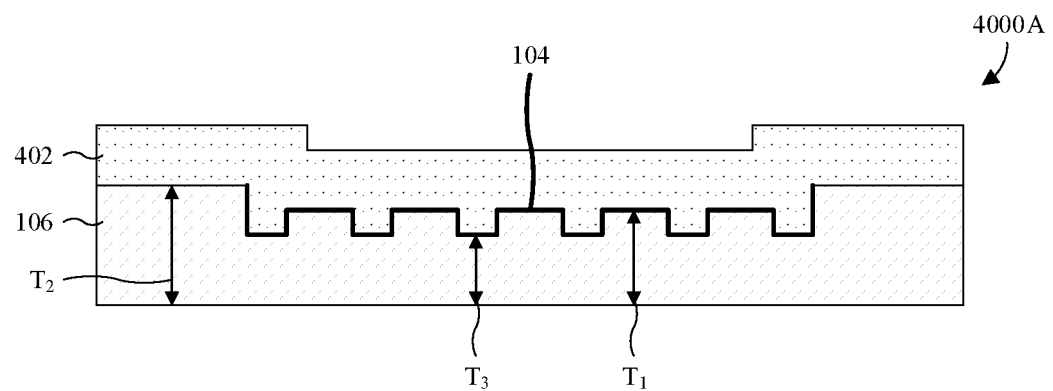
FIGS. 40A, 40B, and 41-48 illustrate a series of cross-sectional views of some alternative embodiments of the method of FIGS. 30, 31A, 31B, and 32-38 in which the at least one cavity is filled with a cavity-fill dielectric layer.

As illustrated by the cross-sectional view 4000A of FIG. 40A, a second semiconductor substrate 106 is patterned to form a cavity 104 as described with regard to FIGS. 30 and 31A. Further, a cavity-fill dielectric layer 402 is deposited covering the second semiconductor substrate 106 and filling the cavity 104. The cavity-fill dielectric layer may, for example, be as described with regard to FIGS. 20A and 2B.

Figure 40B:
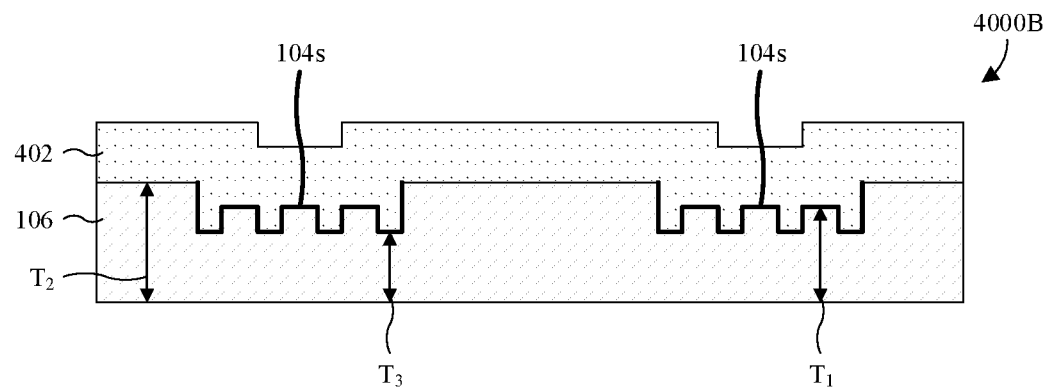

As illustrated by the cross-sectional view 4000B of FIG. 40B, the second semiconductor substrate 106 is alternatively patterned to form multiple small cavities 104s as described with regard to FIG. 31B. Further, the cavity-fill dielectric layer 402 is deposited covering the second semiconductor substrate 106 and filling the small cavities 104s.

Figure 41:
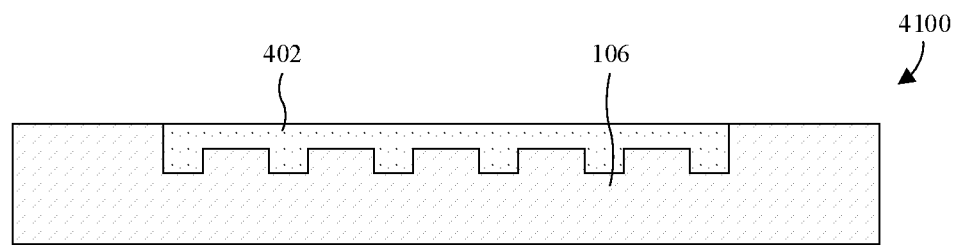

As illustrated by the cross-sectional view 4100 of FIG. 41, a planarization is performed into the cavity-fill dielectric layer 402 to remove the cavity-fill dielectric layer 402 from atop a top surface of the second semiconductor substrate 106. As noted above, FIGS. 40A and 40B are alternatives of each other. FIG. 41 illustrates the method proceeding from FIG. 40A, while skipping FIG. 40B, and hence FIGS. 41-48 use embodiments of the second semiconductor substrate 106 in FIG. 40A. In alternative embodiments, the method proceeds from FIG. 40B, while skipping FIG. 40A, and hence FIGS. 41-48 use embodiments of the second semiconductor substrate 106 in FIG. 40B. The planarization may, for example, be performed by a CMP or some other suitable planarization process.

Figure 42:
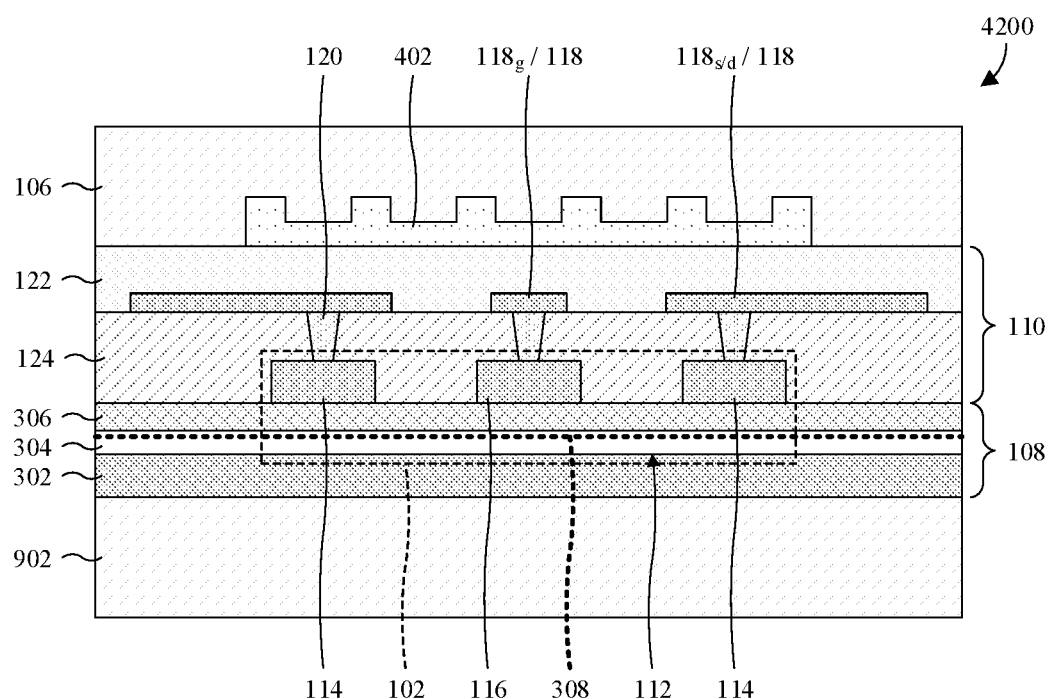
Figure 43:
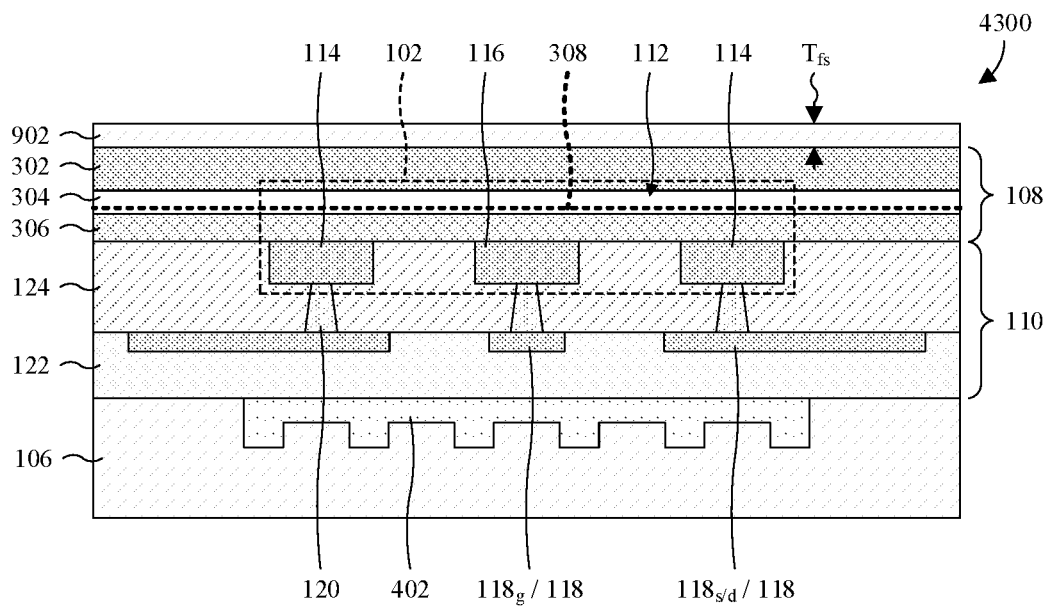
Figure 44:
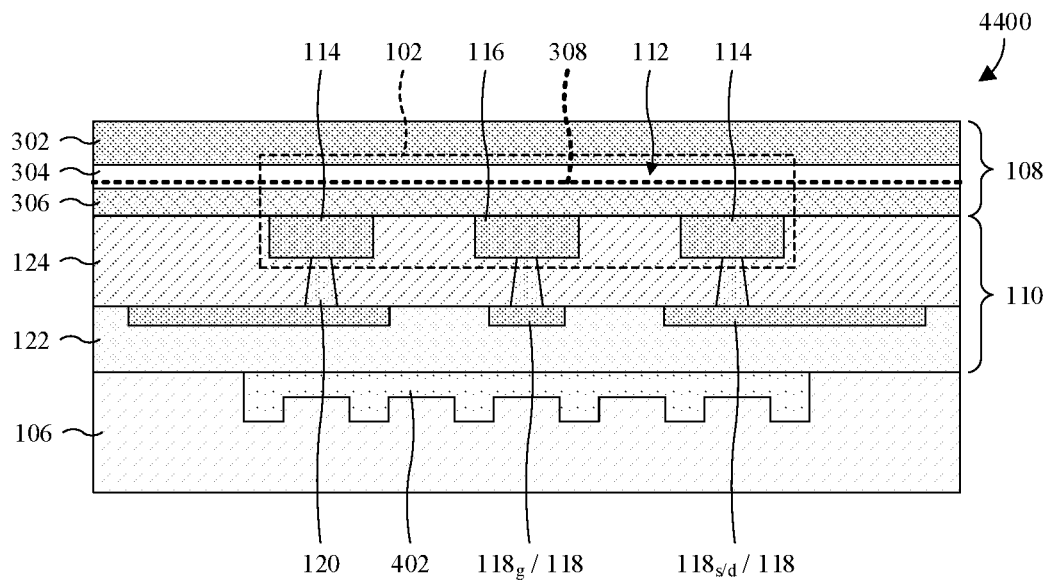
Figure 45:
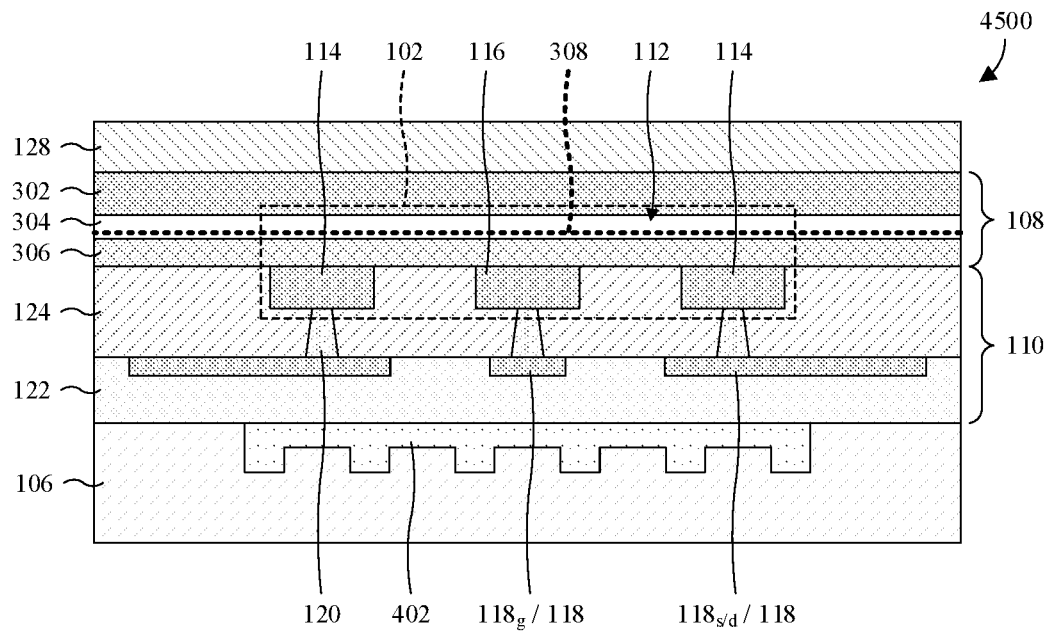
Figure 46:
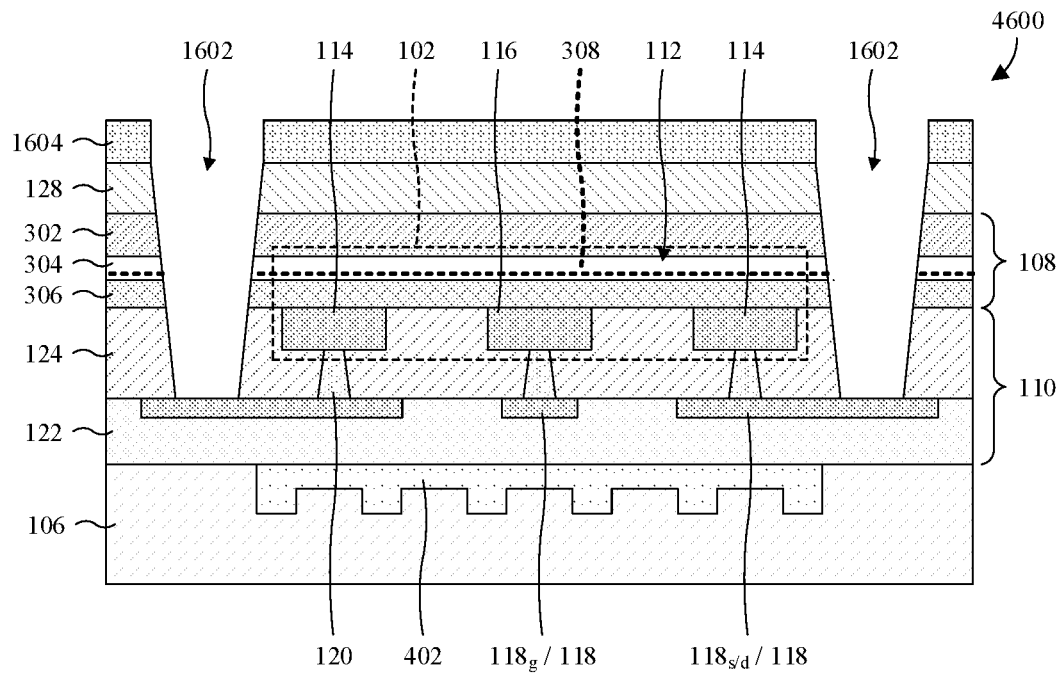
Figure 47:
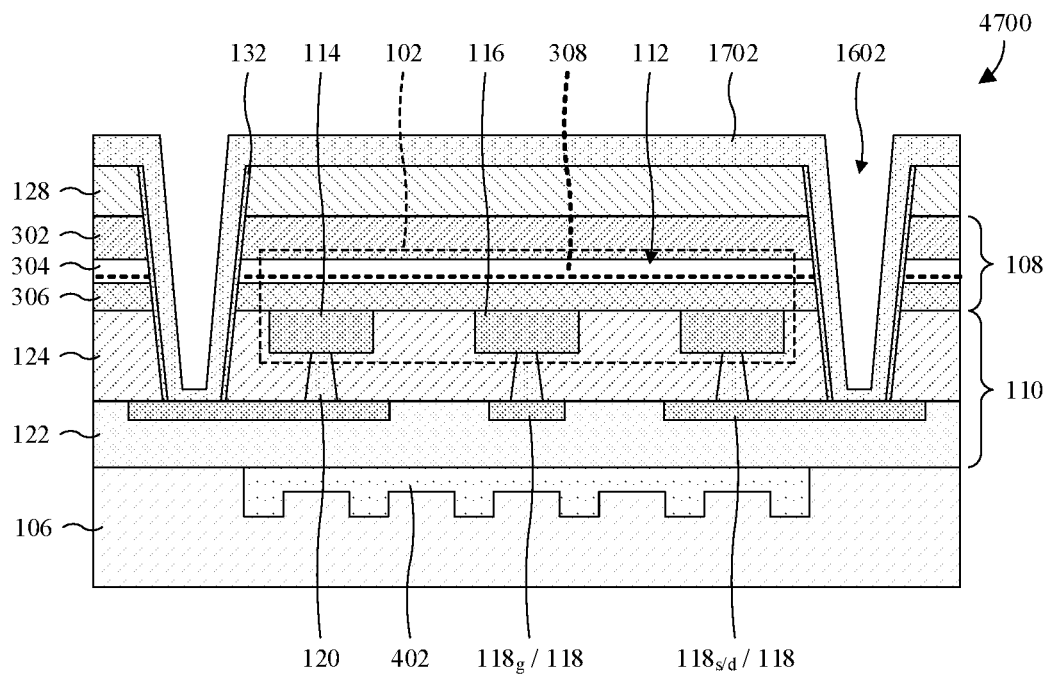
Figure 48:
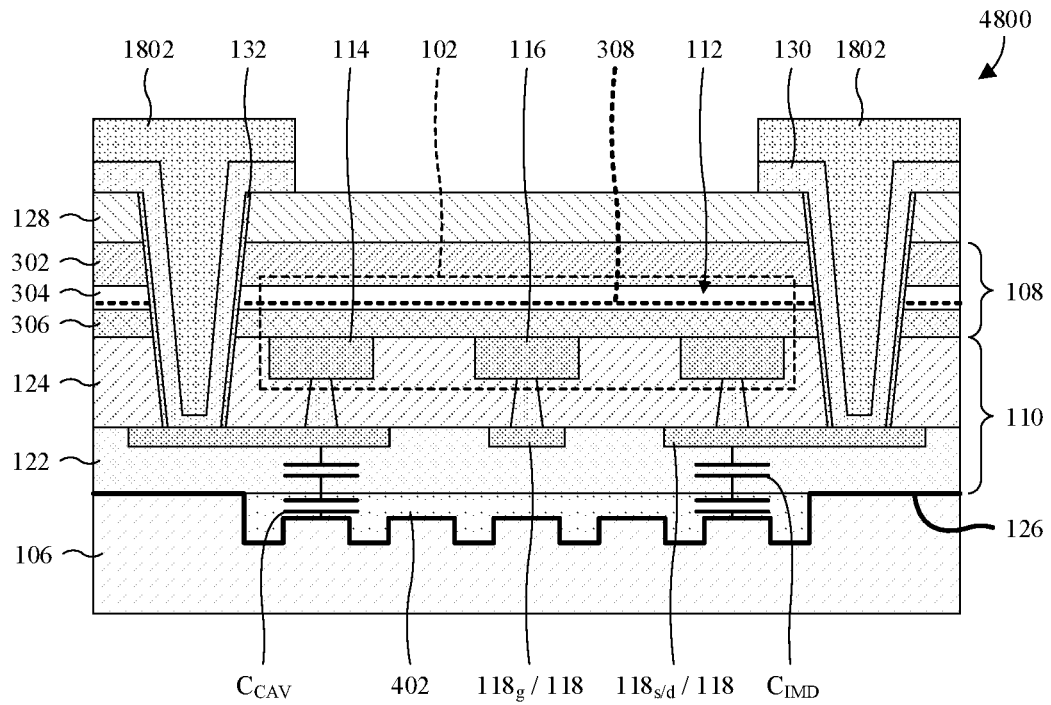

As illustrated by the cross-sectional view 4200 of FIG. 42, the acts at FIGS. 9 and 10 are performed. A semiconductor layer 108 is epitaxially deposited over a first semiconductor substrate 902, and a semiconductor device 102 is formed on the semiconductor layer 108, as described with regard to FIG. 9. An interconnect structure 110 is formed over and electrically coupled to the semiconductor device 102 as described with regard to FIG. 10.

Also illustrated by the cross-sectional view 4200 of FIG. 42, the structure of FIG. 41 is flipped vertically and is arranged over and bonded to the interconnect structure 110. Because of the presence of the cavity-fill dielectric layer 402, bond area between the structure of FIG. 41 and the interconnect structure 110 is large. If the cavity-fill dielectric layer 402 was omitted, the bond area would be small. Because of the large bond area, bond strength is strong. The bonding may, for example, be performed by fusion bonding or by some other suitable type of bonding.

As illustrated by the cross-sectional views 4300-4800 of FIGS. 43-48, the acts at FIGS. 13-18 are performed. At FIG. 43, the structure of FIG. 42 is flipped vertically and the first semiconductor substrate 902 is thinned as described with regard to FIG. 13. At FIG. 44, a remainder of the first semiconductor substrate 902 is removed as described with regard to FIG. 14. At FIG. 45, a passivation layer 128 is deposited over the semiconductor layer 108 as described with regard to FIG. 15. At FIG. 46, the passivation layer 128, the semiconductor layer 108, and the ILD layer 124 are patterned to form contact openings 1602 as described with regard to FIG. 16. At FIG. 47, contact liner layers 132 are formed lining sidewalls of the contact openings 1602, and a conductive layer 1702 is deposited lining the contact openings 1602, as described with regard to FIG. 17. At FIG. 48, the conductive layer 1702 is patterned to form contacts 130 in the contact openings 1602 as described with regard to FIG. 18.

While FIGS. 40A, 40B, and 41-48 are described with reference to a method, it will be appreciated that the structures shown in FIGS. 40A, 40B, and 41-48 are not limited to the method but rather may stand alone separate of the method. While FIGS. 40A, 40B, and 41-48 are described as a series of acts, it will be appreciated that the order of the acts may be altered in other embodiments. While FIGS. 40A, 40B, and 41-48 illustrate and describe as a specific set of acts, some acts that are illustrated and/or described may be omitted in other embodiments. Further, acts that are not illustrated and/or described may be included in other embodiments.

Figure 49:
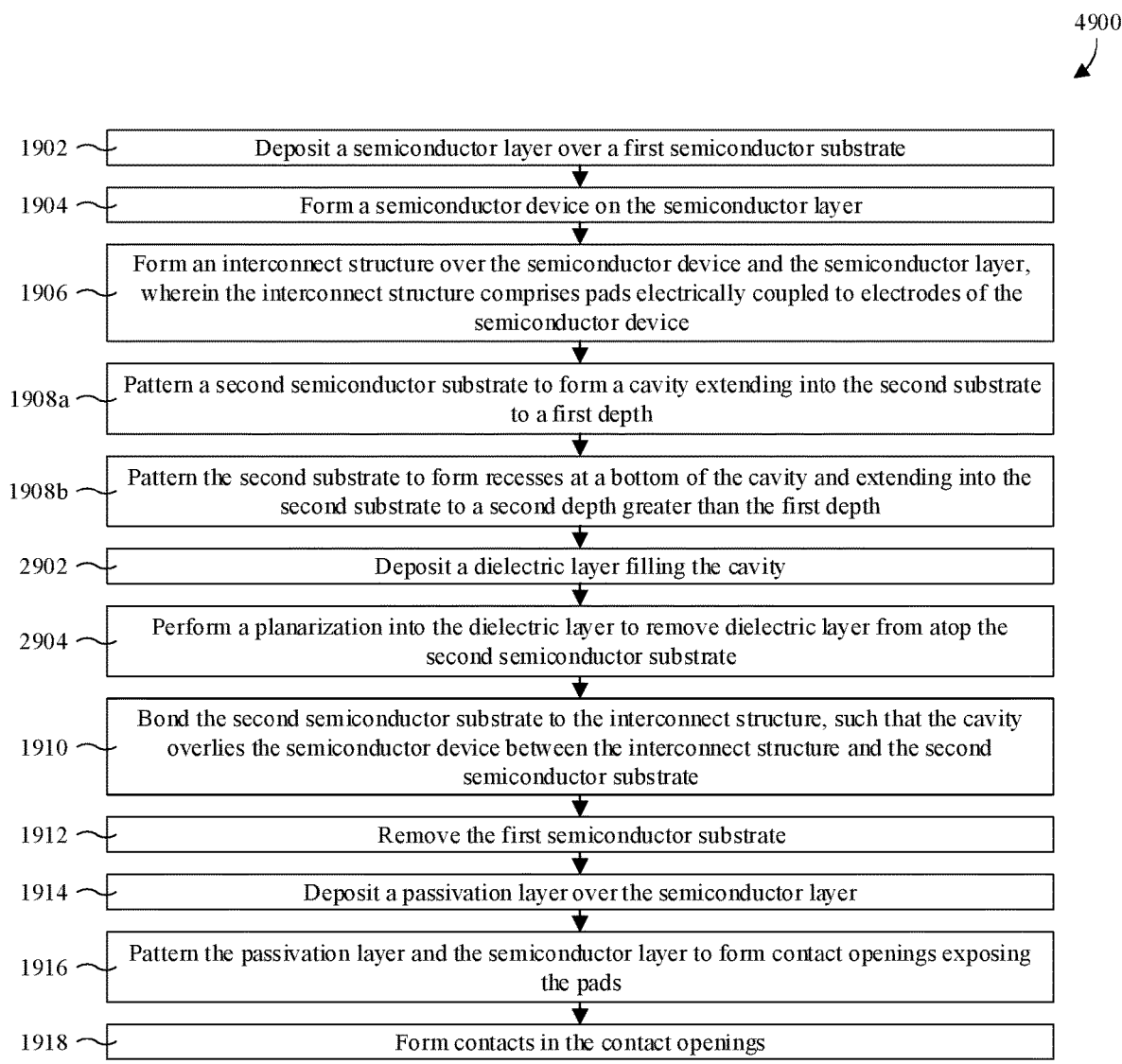
FIG. 49 illustrates a block diagram of some embodiments of the method of FIGS. 40A 40B, and 41-48.

With reference to FIG. 49, a block diagram 4900 of some embodiments of the method of FIGS. 40A, 40B, and 41-48 is provided.

At 1902, a semiconductor layer is deposited over a first semiconductor substrate. See, for example, FIG. 42.

At 1904, a semiconductor device is formed on the semiconductor layer. See, for example, FIG. 42.

At 1906, an interconnect structure is formed over the semiconductor device and the semiconductor layer, wherein the interconnect structure comprises pads electrically coupled to electrodes of the semiconductor device. See, for example, FIG. 42.

At 1908a, a second semiconductor substrate is patterned to form a cavity extending into the second substrate to a first depth. See, for example, FIGS. 30, 40A, and 40B.

At 1908b, the second substrate is patterned to form recesses at a bottom of the cavity and extending into the second substrate to a second depth greater than the first depth. See, for example, FIGS. 31A, 31B, 40A, and 40B.

At 2902, a dielectric layer is deposited filling the cavity. See, for example, FIGS. 40A and 40B.

At 2904, a planarization is performed into the dielectric layer to remove dielectric layer from atop the second semiconductor substrate. See, for example, FIG. 41.

At 1910, the second semiconductor substrate is bonded to the interconnect structure, such that the cavity overlies the semiconductor device between the interconnect structure and the second semiconductor substrate. See, for example, FIG. 42.

At 1912, the first semiconductor substrate is removed. See, for example, FIGS. 43 and 44.

At 1914, a passivation layer is deposited over the semiconductor layer. See, for example, FIG. 45.

At 1916, the passivation layer and the semiconductor layer are patterned to form contact openings exposing the pads. See, for example, FIG. 46.

At 1918, contacts are formed in the contact openings. See, for example, FIGS. 47 and 48.

While the block diagram 4900 of FIG. 49 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

In some embodiments, the present disclosure provides an IC chip including: a semiconductor substrate; a first dielectric region recessed into a top of the semiconductor substrate; an IMD layer overlying the semiconductor substrate and the first dielectric region, wherein the IMD layer is bonded to the top of the semiconductor substrate; a semiconductor layer overlying the IMD layer; and a semiconductor device that is inverted and that is in the semiconductor layer, between the semiconductor layer and the IMD layer, wherein semiconductor device includes a first source/drain electrode overlying the first dielectric region. In some embodiments, the first dielectric region is a cavity. In some embodiments, the first dielectric region is a dielectric layer. In some embodiments, the first dielectric region has a lower dielectric constant than the IMD layer. In some embodiments, a bottom profile of the first dielectric region is uneven. In some embodiments, the IC chip further includes: a first pad in the IMD layer and overlying the first dielectric region, wherein the first pad is electrically coupled to the first source/drain electrode; and a via extending from the first pad to the first source/drain electrode. In some embodiments, the semiconductor device includes a second source/drain electrode on an opposite side of the semiconductor device as the first source/drain electrode, wherein the first dielectric region is continuous and underlies both the first and second source/drain electrodes. In some embodiments, the semiconductor device includes a second source/drain electrode on an opposite side of the semiconductor device as the first source/drain electrode, wherein the IC chip further includes: a second dielectric region recessed into the top of the semiconductor substrate, independent of the first dielectric region, and underling the second source/drain electrode.

In some embodiments, the present disclosure provides another IC chip including: a semiconductor substrate; a semiconductor layer overlying the semiconductor substrate; a semiconductor device on an underside of the semiconductor layer, between the semiconductor layer and the semiconductor substrate; and an interconnect structure between the semiconductor device and the semiconductor substrate, wherein interconnect structure is electrically coupled to the semiconductor device; wherein the semiconductor substrate has a first thickness and a second thickness greater than the first thickness, and wherein the semiconductor device overlies a first portion of the semiconductor substrate at which the semiconductor substrate has the first thickness. In some embodiments, the semiconductor substrate further has a third thickness less than the first thickness, wherein the semiconductor substrate alternates between the first and third thicknesses directly under the semiconductor device. In some embodiments, the semiconductor device has a first source/drain electrode and a second source/drain electrode, wherein the first portion of the semiconductor substrate is continuous from directly under the first source/drain electrode to directly under the second source/drain electrode. In some embodiments, the semiconductor device has a first source/drain electrode and a second source/drain electrode, wherein the first portion of the semiconductor substrate underlies the first source/drain electrode, wherein the semiconductor substrate further has a second portion with the first thickness, and wherein the second portion is spaced from the first portion and underlies the second source/drain electrode. In some embodiments, the semiconductor substrate and the interconnect structure define individual surfaces of a cavity recessed into a top of the semiconductor substrate at the first portion of the semiconductor substrate. In some embodiments, the interconnect structure includes multiple levels of conductive features, including a level closest to the semiconductor substrate, wherein the level closest to the semiconductor substrate includes a pad electrically coupled to the a source/drain electrode of the semiconductor device, and wherein the pad underlies the source/drain electrode and overlies the first portion of the semiconductor substrate.

In some embodiments, the present disclosure provides a method for forming an IC chip, the method including: depositing a semiconductor layer over a first semiconductor substrate; forming a semiconductor device over the semiconductor layer; forming an interconnect structure over and electrically coupled to the semiconductor device; patterning a second semiconductor substrate to form a first cavity in the second semiconductor substrate; bonding the second semiconductor substrate to the interconnect structure, such that the first cavity overlies the semiconductor device; and removing the first semiconductor substrate. In some embodiments, the interconnect structure includes pads, wherein the pads are at a top of the interconnect structure and electrically couple to the semiconductor device, and wherein the method further includes: forming contacts extending through the semiconductor layer respectively to the pads. In some embodiments, the second semiconductor substrate has a higher resistance than the first semiconductor substrate. In some embodiments, the patterning further forms a second cavity in the second semiconductor substrate, wherein the semiconductor device has a pair of source/drain electrodes, and wherein the bonding is such that the first and second cavities respectively overlie the source/drain electrodes. In some embodiments, the method further includes: depositing a cavity-fill dielectric layer covering a top surface of the second semiconductor substrate and filling the first cavity; and performing a planarization into the cavity-fill dielectric layer to remove the cavity-fill dielectric layer from the top surface of the second semiconductor substrate. In some embodiments, the method further includes: patterning the second semiconductor substrate to form recesses at a bottom of the first cavity after and independent of the patterning to form the first cavity.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit (IC) chip comprising:
a semiconductor substrate;
a semiconductor layer overlying the semiconductor substrate; and
a semiconductor device between the semiconductor substrate and the semiconductor layer, wherein the semiconductor device comprises a channel region in the semiconductor layer and further comprises a gate electrode and a source/drain electrode on an underside of the semiconductor layer;
wherein the semiconductor substrate has a first sidewall and a second sidewall facing each other, and wherein at least a portion of the semiconductor device is laterally between the first sidewall and the second sidewall.

2. The IC chip according to claim 1, wherein the second sidewall is laterally between the gate electrode and the source/drain electrode.

3. The IC chip according to claim 1, further comprising:
a contact exposed from over the semiconductor layer and extending through the semiconductor layer, wherein the contact borders the semiconductor device, and wherein the first sidewall is laterally between the contact and the semiconductor device.

4. The IC chip according to claim 1, wherein the first sidewall and the second sidewall extend into the semiconductor substrate from a topmost surface of the semiconductor substrate.

5. The IC chip according to claim 1, further comprising:
a dielectric layer between the semiconductor substrate and the semiconductor device, and having a first dielectric constant; and
a dielectric region underlying the dielectric layer and separating the first sidewall from the second sidewall, wherein the dielectric region has a second dielectric constant different from the first dielectric constant.

6. The IC chip according to claim 1, wherein a thickness of the semiconductor substrate alternates between a first thickness and a second thickness from the first sidewall to the second sidewall.

7. The IC chip according to claim 1, wherein the first sidewall and the second sidewall face each other on a first side of the semiconductor device, wherein the semiconductor substrate has a third sidewall and a fourth sidewall facing each other on a second side of the semiconductor device opposite the first side, and wherein another portion of the semiconductor device is laterally between the third sidewall and the fourth sidewall.

8. An integrated circuit (IC) chip comprising:
a semiconductor substrate;
a semiconductor layer overlying the semiconductor substrate;
a semiconductor device on an underside of the semiconductor layer, between the semiconductor layer and the semiconductor substrate;
a pad between the semiconductor substrate and the semiconductor device;
a contact exposed from over the semiconductor layer and extending through the semiconductor layer to the pad; and
a dielectric region separating the pad from the semiconductor substrate, wherein the dielectric region has a first number of dielectric constants directly under an overlap between the semiconductor device and the pad, and further has a second number of dielectric constants different from the first number directly under an overlap between the contact and the pad.

9. The IC chip according to claim 8, wherein the first number is more than the second number.

10. The IC chip according to claim 8, wherein the first number is two and the second number is one.

11. The IC chip according to claim 8, wherein the dielectric region is recessed into a top of the semiconductor substrate directly under the overlap between the semiconductor device and the pad.

12. The IC chip according to claim 8, wherein the dielectric region comprises an air gap and a dielectric layer overlying the air gap.

13. The IC chip according to claim 8, wherein the semiconductor layer comprises a two-dimensional (2D) carrier gas forming a channel region of the semiconductor device.

14. The IC chip according to claim 8, wherein the semiconductor device comprises a pair of source/drain electrodes, and wherein the dielectric region has a pair of bottom protrusions individual to and respectively underlying the source/drain electrodes.

15. An integrated circuit (IC) chip comprising:
a semiconductor substrate;
a semiconductor layer overlying the semiconductor substrate;
a semiconductor device on an underside of the semiconductor layer, between the semiconductor layer and the semiconductor substrate; and
a pad between the semiconductor substrate and the semiconductor device, wherein the pad is electrically coupled to the semiconductor device;
wherein the pad is separated from the semiconductor substrate by a first distance at a first location directly under the semiconductor device and by a second distance different from the first distance at a second location laterally offset from the semiconductor device.

16. The IC chip according to claim 15, further comprising:
a contact exposed from over the semiconductor layer and extending through the semiconductor layer to the pad, wherein the second location is directly under the contact.

17. The IC chip according to claim 15, further comprising:
a via extending from the pad to the semiconductor device.

18. The IC chip according to claim 15, wherein the semiconductor device comprises a gate electrode, and wherein the IC chip further comprises:
an additional pad level with the pad and between the semiconductor substrate and the semiconductor device, wherein the additional pad is electrically coupled to the gate electrode and is separated from the semiconductor substrate by the second distance.

19. The IC chip according to claim 15, wherein the second distance is less than the first distance.

20. The IC chip according to claim 15, wherein a bottom surface of the pad faces the semiconductor substrate without intervening metal.

* * * * *